(12) United States Patent
Noichi et al.

(10) Patent No.: US 10,615,308 B2
(45) Date of Patent: Apr. 7, 2020

(54) LIGHT EMITTING DEVICE

(71) Applicant: NICHIA CORPORATION, Anan-shi (JP)

(72) Inventors: Takuya Noichi, Kaifu-gun (JP); Hiroaki Kageyama, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/726,641

(22) Filed: Jun. 1, 2015

(65) Prior Publication Data
US 2016/0351756 A1    Dec. 1, 2016

(51) Int. Cl.
*H01L 33/38*    (2010.01)

(52) U.S. Cl.
CPC .................................. *H01L 33/38* (2013.01)

(58) Field of Classification Search
CPC ................................ H01L 33/08; H01L 33/38
See application file for complete search history.

(56) References Cited

U.S. PATENT DOCUMENTS

| | | | |
|---|---|---|---|
| 2008/0185606 A1* | 8/2008 | Sano | ........................ H01L 33/42 257/98 |
| 2011/0284908 A1* | 11/2011 | Muramoto | .............. H01L 33/38 257/98 |
| 2011/0284909 A1 | 11/2011 | Sugizaki | |
| 2011/0297983 A1* | 12/2011 | Nishiuchi | ............. H01L 33/647 257/98 |
| 2013/0033169 A1 | 2/2013 | Ito et al. | |
| 2013/0234192 A1* | 9/2013 | Kim | .................... H01L 33/0008 257/98 |
| 2013/0320381 A1 | 12/2013 | Kojima et al. | |
| 2013/0320383 A1 | 12/2013 | Izuka et al. | |
| 2014/0131753 A1 | 5/2014 | Ishida et al. | |
| 2016/0240759 A1* | 8/2016 | Chae | ........................ H01L 33/36 |

FOREIGN PATENT DOCUMENTS

| | | |
|---|---|---|
| JP | 2010-219324 | 9/2010 |
| JP | 2011-249426 | 12/2011 |
| JP | 2011-258671 | 12/2011 |
| JP | 2012-164911 | 8/2012 |
| JP | 2012-204614 | 10/2012 |
| JP | 2012-227470 | 11/2012 |
| JP | 2013-012545 | 1/2013 |
| JP | 2013-038187 | 2/2013 |
| JP | 2014-112635 | 6/2014 |
| JP | 2014-120722 | 6/2014 |

\* cited by examiner

*Primary Examiner* — Samuel A Gebremariam
*Assistant Examiner* — Jonas T Beardsley
(74) *Attorney, Agent, or Firm* — Mori & Ward, LLP

(57) ABSTRACT

A light emitting device includes a base structure and a light emitting element. The light emitting element includes a first electrode and a second electrode. The first electrode includes a first electrode surface. The second electrode is separately provided from the first electrode. The second electrode includes a second electrode surface. The second electrode surface is spaced apart from the first electrode surface in a second direction different from a first direction. The second electrode surface includes a first part and a second part. The first part extends in a third direction different from each of the first direction and the second direction. The second part extends from the first part in the second direction. At least part of the second part has a curved profile extending from the first part when viewed in the first direction.

44 Claims, 20 Drawing Sheets

LIGHT EMITTING DEVICE

BACKGROUND OF THE INVENTION

Field of the Invention

The present invention relates to a light emitting device.

Discussion of the Background

A light emitting device including a light emitting element such as a light emitting diode (LED) has been known.

SUMMARY OF THE INVENTION

According to one aspect of the present invention, a light emitting device includes a base structure and a light emitting element. The base structure includes a first base surface and a second base surface opposite to the first base surface in a first direction. The light emitting element is configured to emit light. The light emitting element includes a first electrode and a second electrode. The first electrode includes a first electrode surface exposed from the second base surface. The second electrode is separately provided from the first electrode. The base structure includes an intermediate portion provided between the first electrode and the second electrode. The second electrode includes a second electrode surface exposed from the second base surface. The second electrode surface is spaced apart from the first electrode surface in a second direction different from the first direction. The second electrode surface includes a first part and a second part. The first part extends in a third direction different from each of the first direction and the second direction. The second part extends from the first part in the second direction. At least part of the second part has a curved profile extending from the first part when viewed in the first direction.

According to another aspect of the present invention, a light emitting device includes a base structure and a light emitting element. The base structure includes a first base surface and a second base surface opposite to the first base surface in a first direction. The light emitting, element is configured to emit light. The light emitting element includes a first electrode and a second electrode. The first electrode includes a first electrode surface exposed from the second base surface. The second electrode is separately provided from the first electrode. The base structure includes an intermediate portion provided between the first electrode and the second electrode. The second electrode includes a second electrode surface and a second contact surface. The second electrode surface is exposed from the second base surface. The second electrode surface is spaced apart from the first electrode surface in a second direction different from the first direction. The second electrode surface includes a first part and a second part. The first part extends in a third direction different from each of the first direction and the second direction. The second part extends from the first part in the second direction. The second contact surface is opposite to the second electrode surface in the first direction. The second part overlaps with an area of the second contact surface when viewed from the first direction.

According to the other aspect of the present invention, a light emitting device includes a base structure and a light emitting element. The base structure includes a first base surface and a second base surface opposite to the first base surface in a first direction. The light emitting element is configured to emit light. The light emitting element includes a first electrode and a second electrode. The first electrode includes a first electrode surface exposed from the second base surface. The second electrode is exposed from the second base surface and separately provided from the first electrode surface. The base structure includes an intermediate portion provided between the first electrode and the second electrode. The second electrode includes a second electrode surface provided in the second base surface when viewed from the first direction. The second electrode surface is spaced apart from the first electrode surface in a second direction different from the first direction. The second electrode surface includes a first part and a second part. The first part extends in a third direction different from each of the first direction and the second direction. The second part includes extending portions extending from the first part in the second direction. The extending portions are spaced apart from each other in the third direction. Each of the extending portions including a first end having a straight edge.

According to further aspect of the present invention, a light emitting device includes a base structure and a light emitting element. The base structure includes a first base surface and a second base surface opposite to the first base surface in a first direction. The light emitting element is configured to emit light. The light emitting element includes a first semiconductor layer, a first electrode, and a second electrode. The first electrode includes a first electrode surface and a first contact surface. The first electrode surface is exposed from the second base surface. The first contact surface contacts the first semiconductor layer. The second electrode is provided separately from the first electrode. The base structure includes an intermediate portion provided between the first electrode and the second electrode. The second electrode includes a second electrode surface exposed from the second base surface. The second electrode surface is spaced apart from the first electrode surface in a second direction different from the first direction. The second electrode surface includes a first part and a second part. The first part extends in a third direction different from each of the first direction and the second direction. The second part extends from the first part in the second direction. The second part is provided to avoid overlapping with an area of the first contact surface when viewed from the first direction.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings. The size or positional relationship of members shown in the drawings may be exaggerated or a portion of a component may not be shown in the drawings to schematically illustrate the embodiments. Dashed lines in the drawings show portions of components that are invisible from outside the light emitting devices.

DESCRIPTION OF THE EMBODIMENTS

Figure 1:
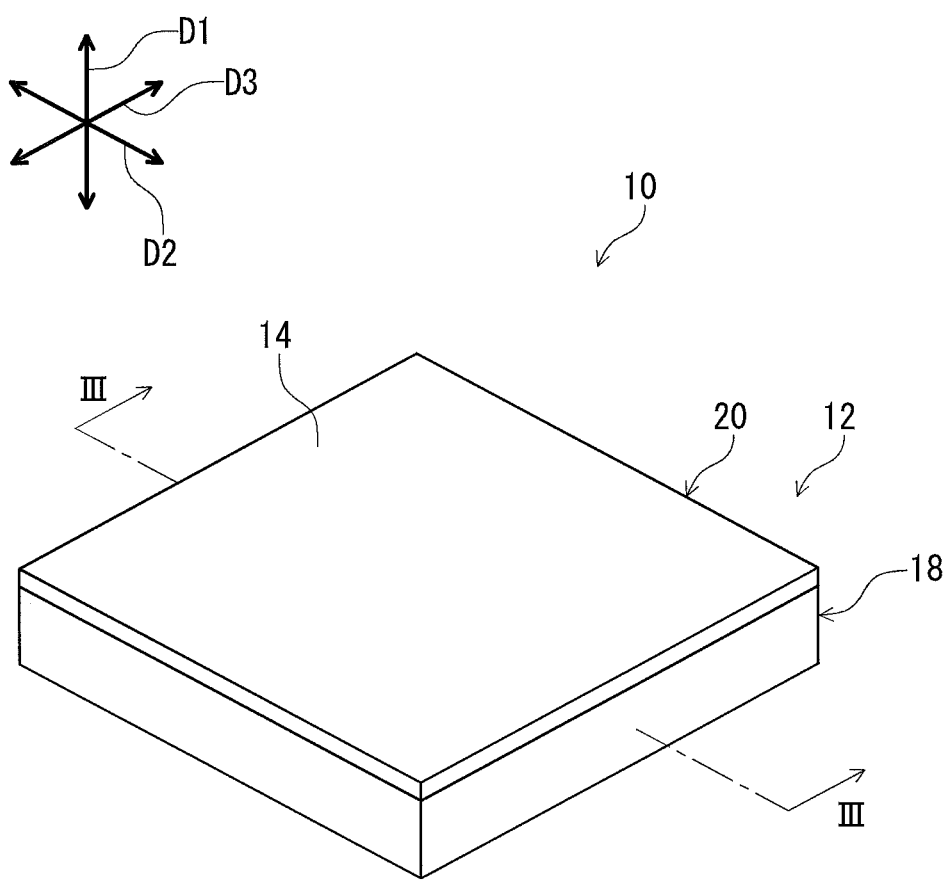
FIG. 1 is a schematic perspective view of a light emitting device in accordance with a first embodiment.

The embodiments will now be described with reference to the accompanying drawings, wherein like reference numerals designate corresponding or identical elements throughout the various drawings.

First Embodiment

Figure 2:
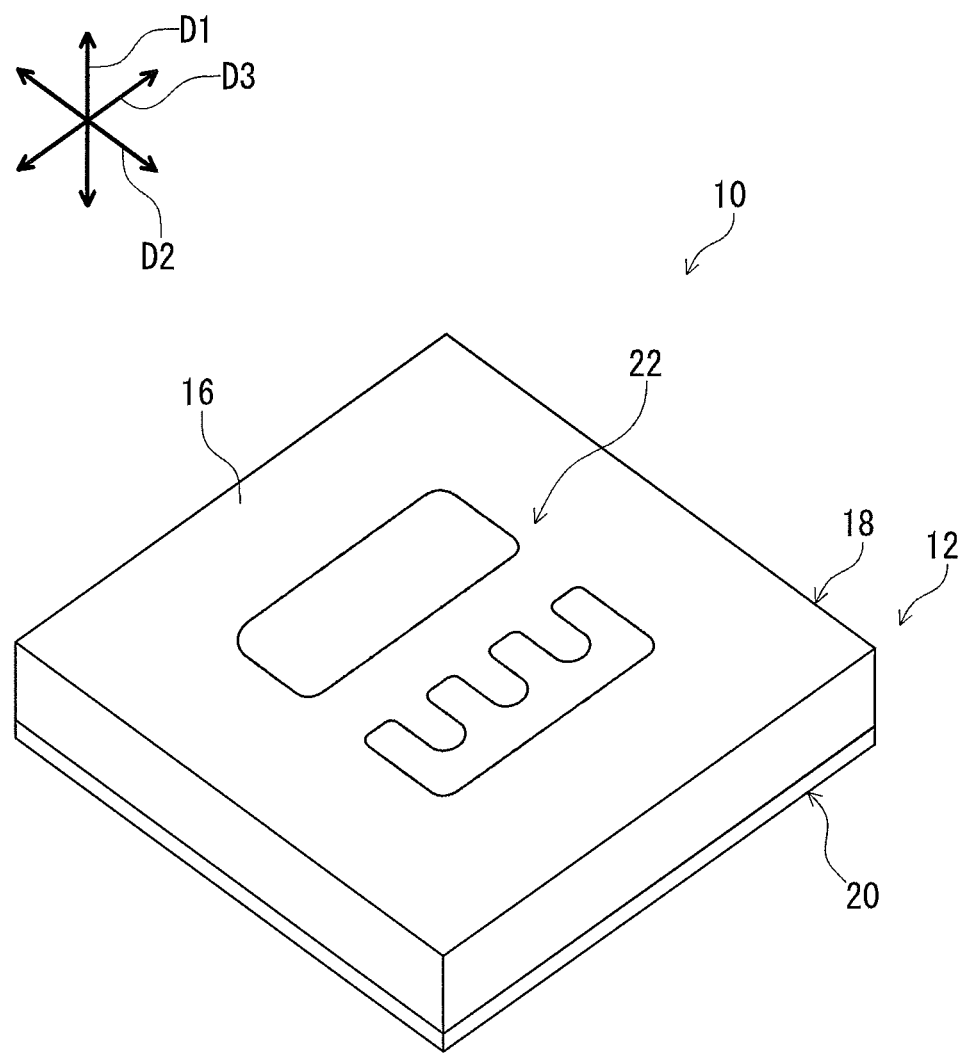
FIG. 2 is a schematic perspective view of the light emitting device illustrated in FIG. 1.

Referring initially to FIG. 1, a light emitting device 10 in accordance with a first embodiment includes a base structure 12. As seen in FIGS. 1 and 2, the base structure 12 includes a first base surface 14 (FIG. 1) and a second base surface 16 (FIG. 2) opposite to the first base surface 14 in a first direction D1. The base structure 12 includes a base member 18, a wavelength conversion member 20 and a light transmissive member 34.

In the present embodiment, a three-dimensional coordinate is defined with respect to the light emitting device 10. The first direction D1 is perpendicular to the second base surface 16. A second direction D2 and a third direction D3 are defined along the second base surface 16. The second direction D2 is perpendicular to the first direction D1. The third direction D3 is perpendicular to each of the first direction D1 and the second direction D2. However, the second direction D2 is not limited to a direction perpendicular to the first direction D1. The third direction D3 is not limited to a direction perpendicular to each of the first direction D1 and the second direction D2. The second direction D2 can be different from the first direction D1. The third direction D3 can be different from each of the first direction D1 and the second direction D2. It is noted that the first direction D1 refers to a direction from the first base surface 14 to the second base surface 16 and/or from the second base surface 16 to the first base surface 14 in FIG. 3, and the second direction D2 and the third direction D3 are similar to that.

Figure 3:
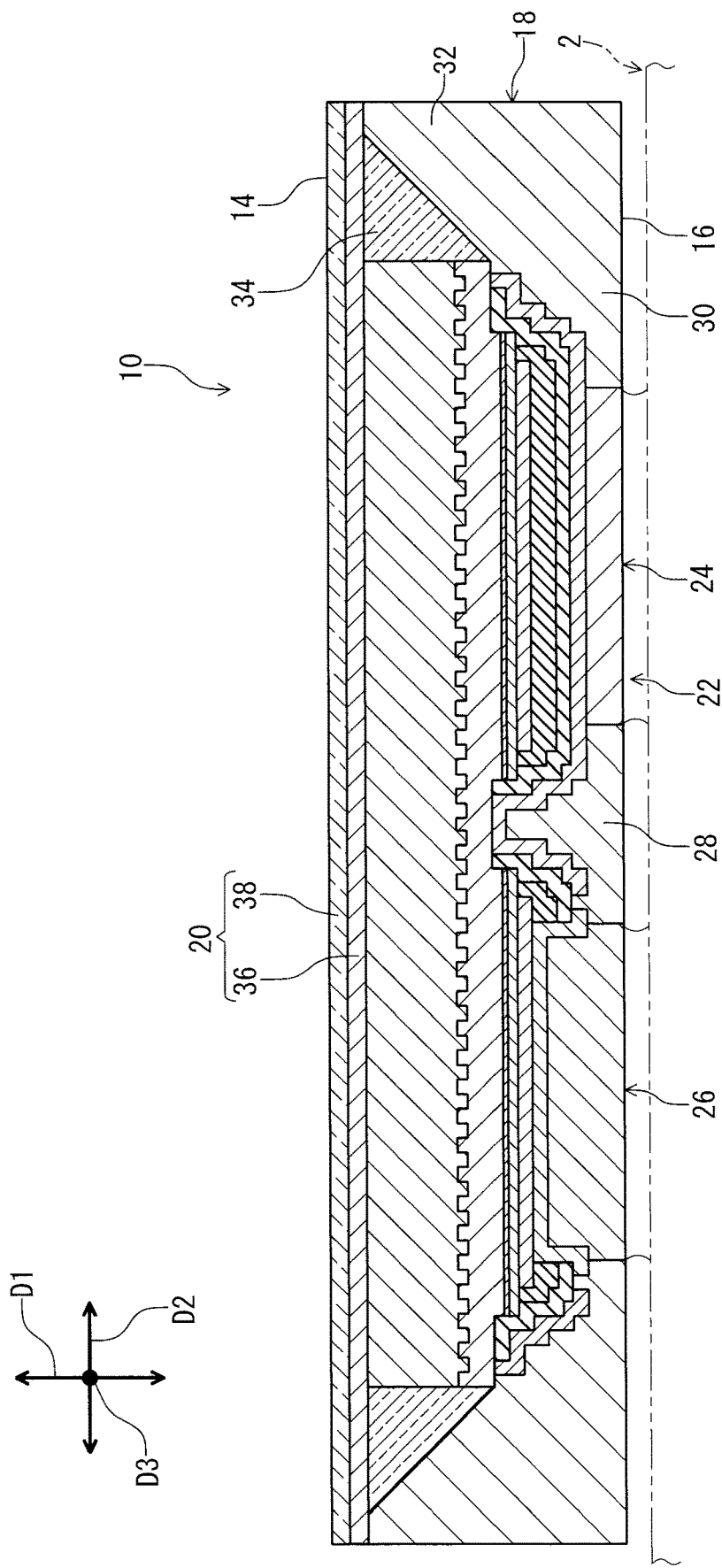
FIG. 3 is a schematic cross-sectional view of the light emitting device taken along line III-III of FIG. 1.

As seen in FIG. 3, the light emitting device 10 includes a light emitting element 22. The light emitting element 22 is configured to emit light. Examples of the light emitting element 22 include a light emitting diode (LED). The light emitting element 22 is provided in the base structure 12. For example, the light emitting device 10 is a packaged chip configured to be mounted to an external substrate 2.

The light emitting element 22 includes a first electrode 24 and a second electrode 26. The second electrode 26 is separately provided from the first electrode 24. The base structure 12 includes an intermediate portion 28 provided between the first electrode 24 and the second electrode 26. The intermediate portion 28 is filled with the base member 18. Specifically, each of the first electrode 24 and the second electrode 26 is partially embedded in the base member 18. The base member 18 includes the intermediate portion 28.

The base member 18 includes a light reflection material to reflect light emitted from the light emitting element 22. Examples of the light reflection material include potassium titanate (e.g., $K_2TiO_3$), titanium oxide (e.g., $TiO_2$), aluminum oxide ($Al_2O_3$), aluminum nitride (e.g., AlN), and composite of aluminum and silicon dioxide (e.g., $SiO_2$).

Figure 4:
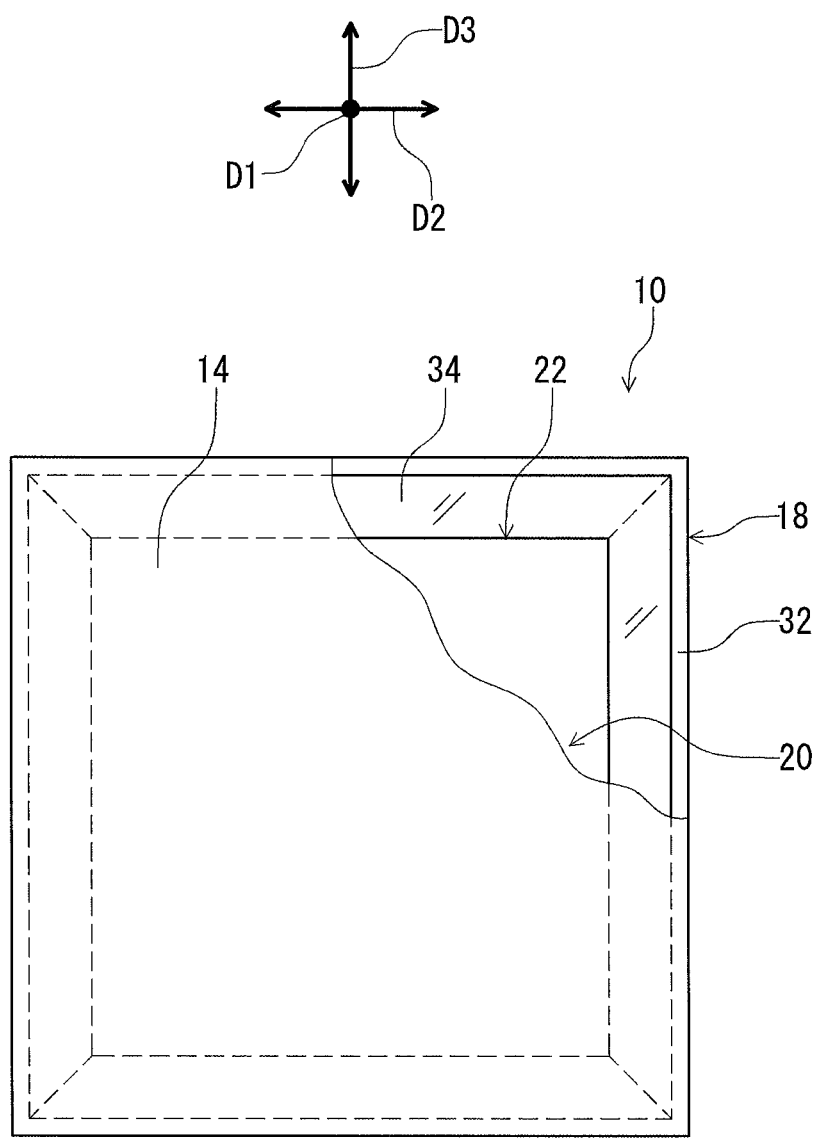
FIG. 4 is a schematic plan view of the light emitting device illustrated in FIG. 1 with a wavelength conversion member partially omitted.

As seen in FIGS. 3 and 4, the base member 18 includes a base portion 30 and a wall 32. The wall 32 protrudes from the base portion 30 in the first direction D1 to surround the light emitting element 22. The wall 32 surrounds the light emitting element 22 when viewed from the first direction D1. The light transmissive member 34 is provided between the wall 32 and the light emitting element 22 to cover the light emitting element 22. The light transmissive member 34 surrounds the light emitting element 22 when viewed from the first direction D1. A part of light emitted from the light emitting element 22 passes through the light transmissive member 34. Light reflected by the base member 18 also passes through the light transmissive member 34. The light transmissive member 34 has optical transmissiveness to extract light toward the first base surface 14. For example, the light transmissive member 34 includes an optical transmissive material such as a silicone resin, an epoxy resin, and an acrylic resin.

The wavelength conversion member 20 converts a first wavelength of light emitted from the light emitting element 22 to a second wavelength different from the first wavelength. For example, the wavelength conversion member 20 converts a wavelength of a part of blue light emitted from the light emitting element 22 to a wavelength of yellow light. The other part of the blue light and the converted yellow light are emitted from the wavelength conversion member 20 as white light. The wavelength conversion member 20 is opposite to the second base surface 16 relative to the light emitting element 22. In the present embodiment, the wavelength conversion member 20 corresponds to the first base surface 14.

In the present embodiment, the wavelength conversion member 20 includes a wavelength conversion layer 36 and a protection layer 38. The wavelength conversion layer 36 is provided between the light emitting element 22 and the protection layer 38. The wavelength conversion layer 36 includes a wavelength conversion material such as an oxide-based fluorescent material, a sulfide-based fluorescent material, and a nitride-based fluorescent material. The protection layer 38 covers the wavelength conversion layer 36 to protect the wavelength conversion layer 36. The protection layer 38 includes light transmissive filler such as silica. The wavelength conversion layer 36 and the protection layer 38 have optical transmissiveness. For example, each of the wavelength conversion layer 36 and the protection layer 38 includes an optically-transmissive material such as a silicone resin, an epoxy resin, and an acrylic resin.

Figure 5:
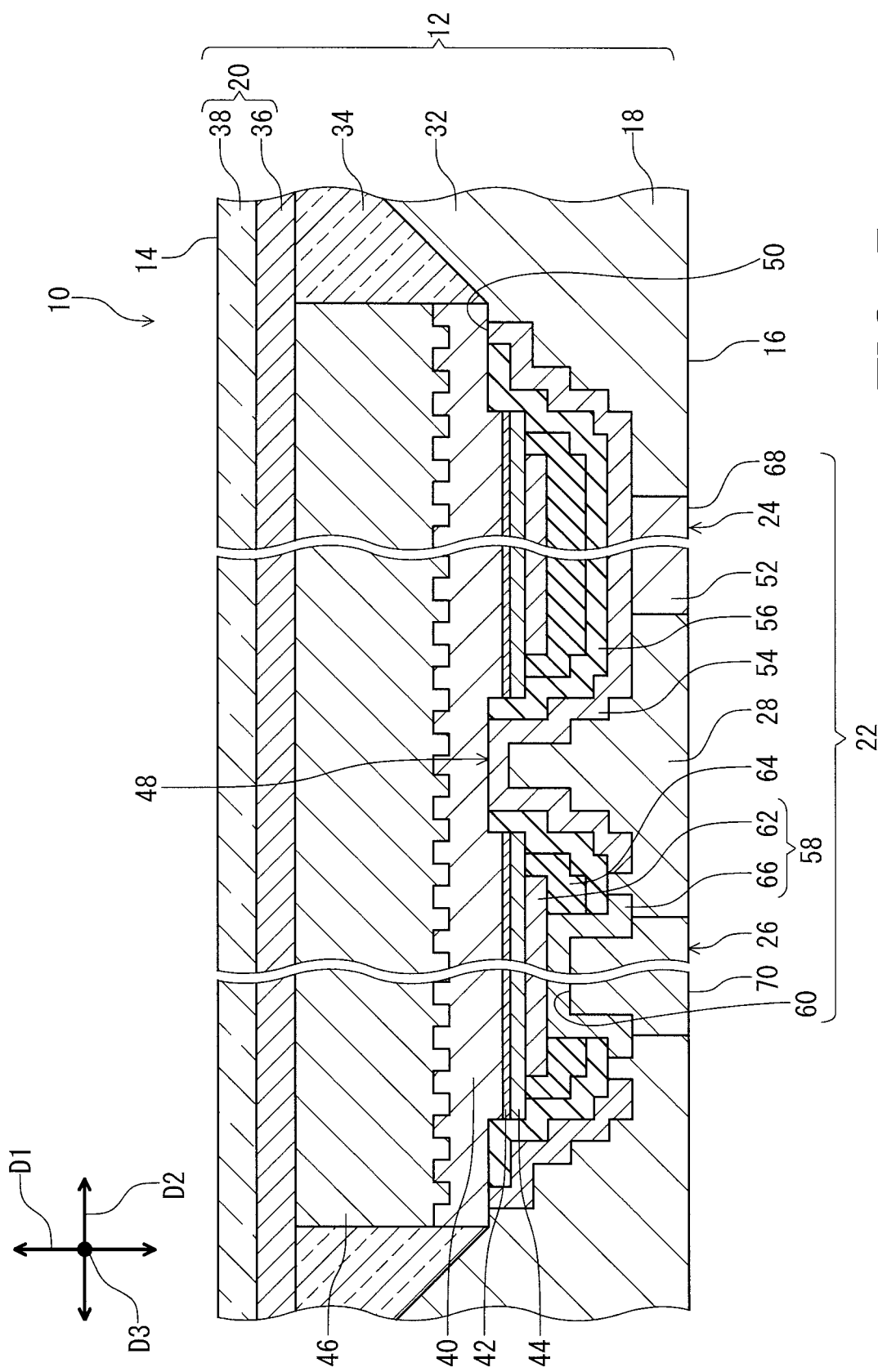
FIG. 5 is a schematic partial enlarged cross-sectional view of the light emitting device taken along line III-III of FIG. 1.

As seen in FIG. 5, the light emitting element 22 includes a first semiconductor layer 40, a light emitting layer 42, and a second semiconductor layer 44. The second semiconductor layer 44 is coupled to the first semiconductor layer 40 via the light emitting layer 42. In the present embodiment, the first semiconductor layer 40 corresponds to an n-type semiconductor layer, and the second semiconductor layer 44 corresponds to a p-type semiconductor layer. The first electrode 24 corresponds to an n-side electrode, and the second electrode 26 corresponds to a p-side electrode. The light emitting element 22 includes a substrate 46. For example, the substrate 46 can be a sapphire substrate. The first semiconductor layer 40 is provided on the substrate 46.

The first electrode 24 includes a first contact surface 48 contacting the first semiconductor layer 40. In the present embodiment, the first electrode 24 include a first additional contact surface 50 contacting the first semiconductor layer 40. The first contact surface 48 and the first additional contact surface 50 are provided inside the base structure 12 and are not exposed to the outside of the light emitting device 10.

In the present embodiment, the first electrode 24 include a first electrode body 52 and a first electrode layer 54. The first electrode body 52 is coupled to the first electrode layer 54. The light emitting element 22 includes a first electrical insulation layer 56 and a second additional electrode 58. The first electrical insulation layer 56 is provided between at least the first electrode 24 and the second additional electrode 58.

The second additional electrode 58 contacts the second semiconductor layer 44. The second electrode 26 includes a second contact surface 60 contacting the second additional electrode 58. The second contact surface 60 is provided inside the base structure 12, is not exposed from the base structure 12. In the present embodiment, the second additional electrode 58 includes a base electrode layer 62 and an intermediate electrode layer 66. The base electrode layer 62 is provided on the second semiconductor layer 44 and contacts the second semiconductor layer 44. A second electrical insulation layer 64 covers the base electrode layer 62. The intermediate electrode layer 66 is coupled to the base electrode layer 62 via openings in the second electrical insulation layer 64. The second contact surface 60 contacts the intermediate electrode layer 66.

Figure 6:
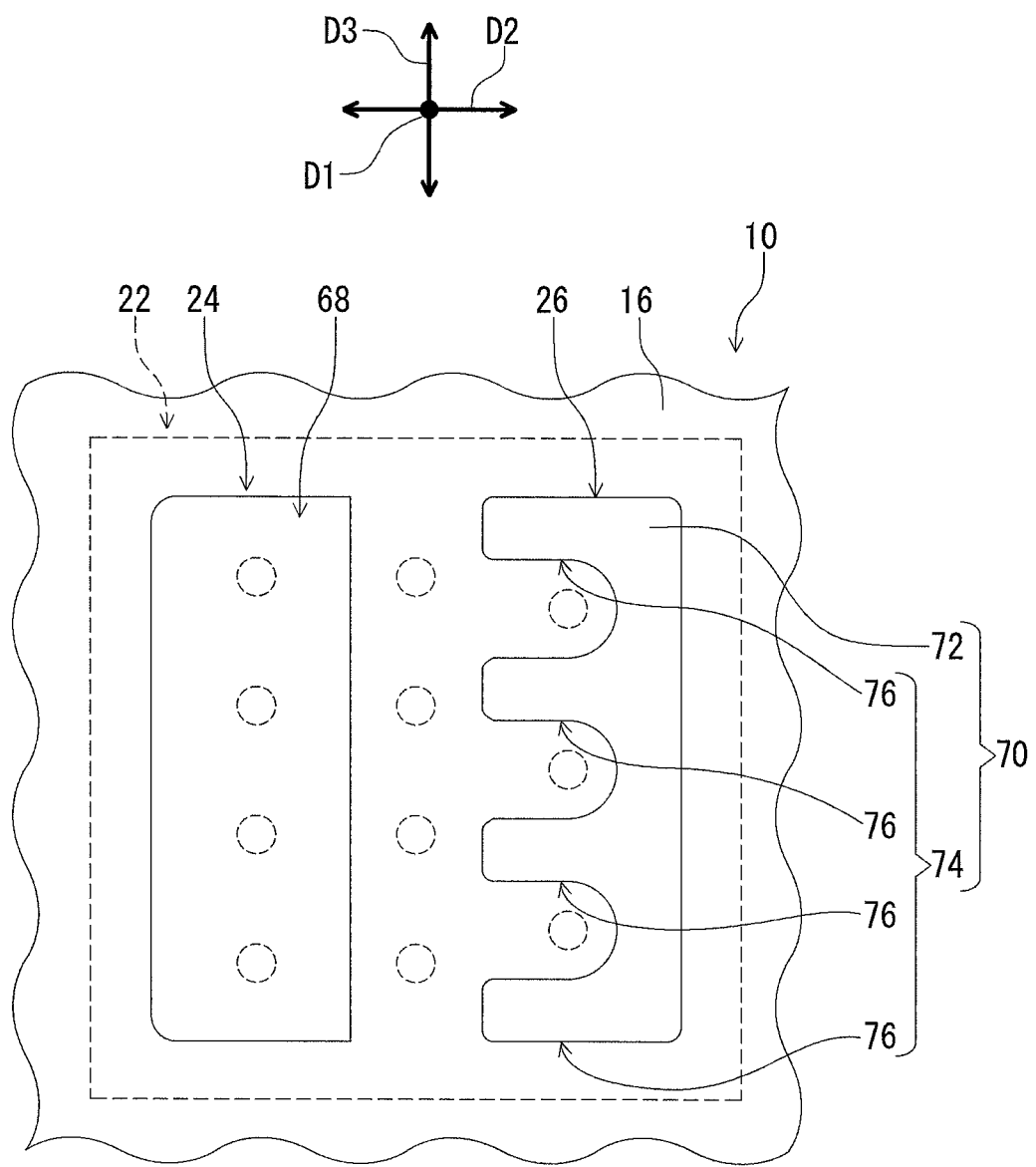
FIG. 6 is a schematic partial plan view of the light emitting device illustrated in FIG. 1.

As seen in FIG. 6, the first electrode 24 includes a first electrode surface 68 exposed from the second base surface 16. In the present embodiment, the first electrode surface 68 is provided on the first electrode body 52 (FIG. 5). The second electrode 26 includes a second electrode surface 70 exposed from the second base surface 16. The second base surface 16, the first electrode surface 68, and the second electrode surface 70 are on a same plane, and these surfaces are mounted to the external substrate 2 (FIG. 3) with solder, for example. The first electrode surface 68 and the second electrode surface 70 are electrically connected to terminals of the external substrate 2 (FIG. 3).

As seen in FIG. 5, in the first electrode 24, the first contact surface 48 is provided on a side opposite to the first electrode surface 68 in the first direction D1. The first contact surface 48 faces the first semiconductor layer 40. In the second electrode 26, the second contact surface 60 is provided on a side opposite to the second electrode surface 70 in the first direction D1. The second contact surface 60 faces the second semiconductor layer 44.

As seen in FIG. 6, the second electrode surface 70 is spaced apart from the first electrode surface 68 in the second direction D2 different from the first direction D1. The first electrode surface 68 has a substantially square shape when viewed from the first direction D1. The second electrode surface 70 has a shape different from a shape of the first electrode surface 68 when viewed from the first direction D1.

The second electrode surface 70 includes a first part 72 and a second part 74. The first part 72 extends in the third direction D3 different from each of the first direction D1 and the second direction D2. The second part 74 extends from the first part 72 in the second direction D2. In the present embodiment, the second part 74 extends from the first part 72 toward the first electrode surface 68 in the second direction D2. The second part 74 includes extending portions 76 extending from the first part 72 in the second direction D2. The extending portions 76 are spaced apart from each other in the third direction D3. The extending portions 76 extend from the first part 72 toward the first electrode surface 68 in the second direction D2.

Figure 7:
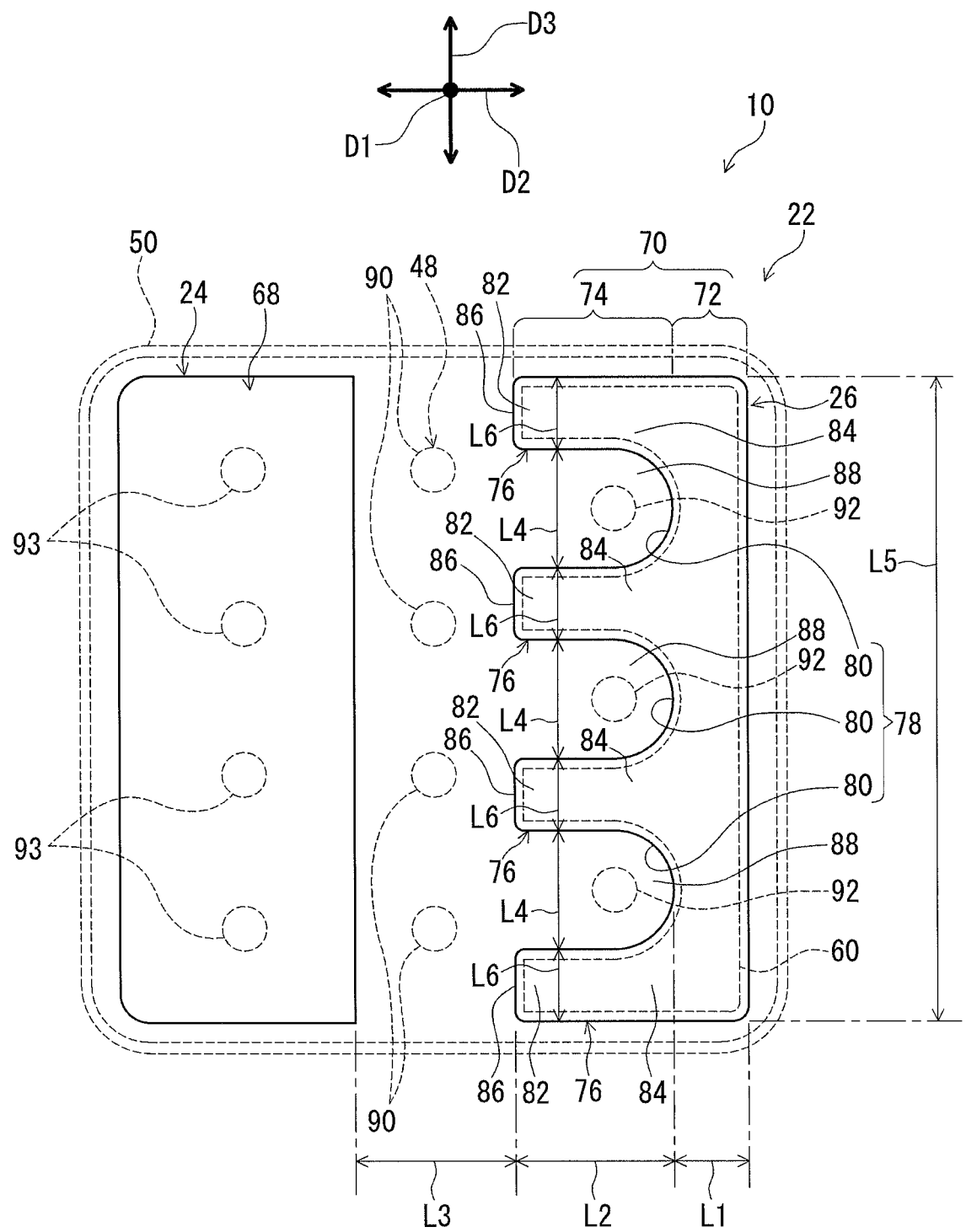
FIG. 7 is a schematic partial enlarged plan view of the light emitting device illustrated in FIG. 1.

As seen in FIG. 7, at least part of the second part 74 has a curved profile 78 extending from the first part 72 when viewed in the first direction D1. In the present embodiment, the second electrode surface 70 includes curved edges 80 defining the curved profile 78. Each of the curved edges 80 extends from the first part 72. The curved edges 80 are respectively provided between adjacent two of the extending portions 76. However, the second electrode surface 70 can include at least one curved edge 80 defining at least part of the curved profile 78.

Each of the extending portions 76 includes a first end 82 and a second end 84 opposite to the first end 82 in the second direction D2. The first end 82 has a straight edge 86. The straight edge 86 extends in the third direction D3. The second end 84 is coupled to the first part 72. The curved edge 80 is provided so as to connect adjacent two of the second ends 84.

In the present embodiment, the intermediate areas 88 are respectively provided between the adjacent two of the extending portions 76 in the third direction D3 when viewed from the first direction D1. The intermediate areas 88 respectively include substantially round ends defined by the curved edges 80. The second base surface 16 can include at least one intermediate area 88 provided between the adjacent two of the extending portions 76 in the third direction D3 when viewed from the first direction D1.

A total number of the first part 72 is not limited to the present embodiment. The second electrode surface 70 can include at least one first part 72. A total number of the extending portions 76 is not limited to the present embodiment. The second part 74 can include at least one extending portion 76. A total number of the curved edges 80 is not limited to the present embodiment. The second electrode surface 70 can include at least one curved edge 80.

The first contact surface 48 has a shape different from a shape of the first electrode surface 68. The first contact surface 48 includes first contact parts 90 and second contact parts 92. The first contact parts 90 are substantially aligned with each other in the third direction D3 and each contact the first semiconductor layer 40 (FIG. 5). The second contact parts 92 are substantially aligned with each other in the third direction D3 and each contact the first semiconductor layer 40 (FIG. 5). A total number (e.g., three) of the second contact parts 92 is different from a total number (e.g., four) of the first contact parts 90.

In the present embodiment, the first contact parts 90 are arranged in the third direction D3 at substantially regular intervals. The second contact parts 92 are arranged in the third direction D3 at substantially regular intervals. The first contact parts 90 are provided between the first electrode surface 68 and the second electrode surface 70 in the second direction D2 when viewed from the first direction D1.

The first contact surface 48 includes first additional contact parts 93. The first additional contact parts 93 are substantially aligned with each other in the third direction D3 and each contact the first semiconductor layer 40 (shown in FIG. 5 and FIG. 7). The first electrode surface 68 overlaps with the first additional contact parts 93. A total number (e.g., three) of the second contact parts 92 is different from a total number (e.g., four) of the first additional contact parts 93. The total number of the first contact parts 90 is equal to the total number of the first additional contact parts 93.

The second electrode surface 70 is provided to avoid overlapping with an area of the first contact surface 48 when viewed from the first direction D1. Specifically, the second part 74 is provided to avoid overlapping with the area of the first contact surface 48 when viewed from the first direction D1. The extending portions 76 are provided to avoid overlapping with the area of the first contact surface 48 when viewed from the first direction D1.

In the present embodiment, the second contact parts 92 are respectively provided between adjacent two of the extending portions 76 in the third direction D3. The curved profile 78 is spaced apart from the area of the first contact surface 48 when viewed from the first direction D1. The curved edges 80 are respectively spaced apart from the areas of the second contact parts 92 when viewed from the first direction D1.

Two of the extending portions 76 are arranged to respectively face the areas of two of the first contact parts 90 in the second direction D2 when viewed from the first direction D1. At least one of the extending portions 76 can be arranged to face the area of the first contact surface 48 in the second direction D2 when viewed from the first direction D1.

The second contact surface 60 (FIG. 5) has a shape different from a shape of the second electrode surface 70. In the present embodiment, the first part 72 and the second part 74 overlap with an area of the second contact surface 60 when viewed from the first direction D1.

The first part 72 has a first length L1 defined in the second direction D2. The second part 74 has a second length L2 defined in the second direction D2. The second length L2 is longer than the first length L1. Specifically, the extending portions 76 respectively have second lengths L2 defined in the second direction D2. In the present embodiment, each of the second lengths L2 of the extending portions 76 is longer than the first length L1. However, at least one of the second lengths L2 can be longer than the first length L1. The second length L2 can be substantially equal to or shorter than the first length L1.

In the present embodiment, the second lengths L2 of the extending portions 76 are substantially equal to each other. However, at least two of the second lengths L2 of the extending portions 76 are substantially equal to each other.

In the present embodiment, the second lengths L2 of the extending portions 76 are substantially equal to a minimum distance L3 between the first electrode surface 68 and the second electrode surface 70 in the second direction D2. However, at least one of the second lengths L2 of the extending portions 76 can be substantially equal to the minimum distance L3 between the first electrode surface 68 and the second electrode surface 70 in the second direction D2. In other words, at least one of the second lengths L2 can be different from the minimum distance L3.

In the present embodiment, the second lengths L2 of the extending portions 76 are longer than a maximum distance L4 between adjacent two of the extending portions 76 in the third direction D3. However, at least one of the second lengths L2 of the extending portions 76 can be longer than the maximum distance L4 between adjacent two of the extending portions 76 in the third direction D3. At least one of the second lengths L2 of the extending portions 76 can be substantially equal to or shorter than the maximum distance L4.

The first part 72 has a third length L5 defined in the third direction D3. The extending portions 76 respectively have fourth lengths L6 defined in the third direction D3. The fourth lengths L6 are shorter than the third length L5. The fourth lengths L6 are substantially equal to each other. However, at least one of the fourth lengths L6 can be different from another fourth lengths L6. The fourth lengths L6 are shorter than the maximum distance L4.

Second Embodiment

A light emitting device 210 in accordance with a second embodiment will be described below referring to FIG. 8. The light emitting device 210 has substantially the same structure as the light emitting device 10 except for the second electrode surface 70 and the first contact surfaces 48. Thus, elements having substantially the same function as those in the first embodiment will be numbered the same here, and detail descriptions and/or illustrations may be omitted here for the sake of brevity.

Figure 8:
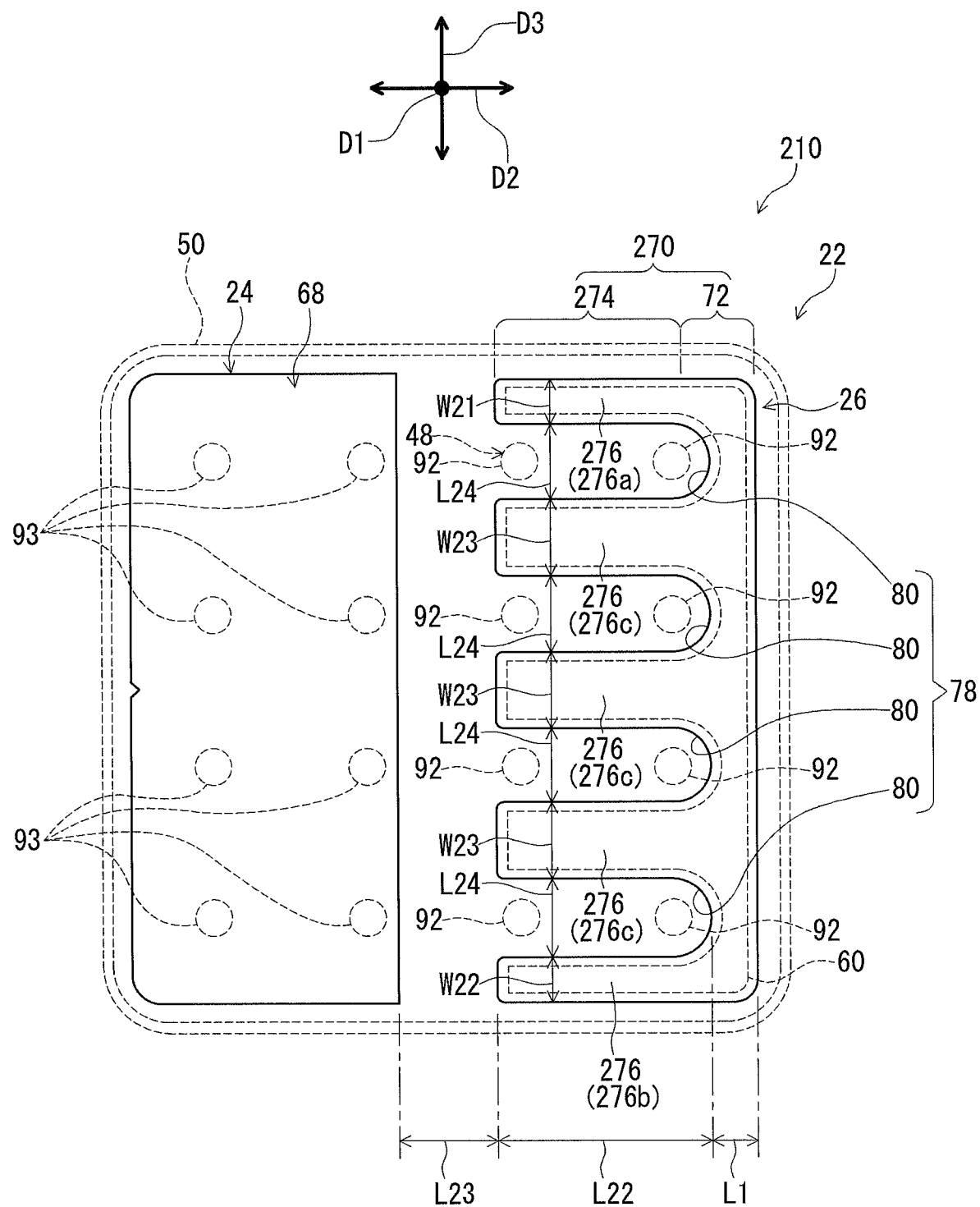
FIG. 8 is a schematic partial plan view of a light emitting device in accordance with a second embodiment.

As seen in FIG. 8, in the light emitting device 210, the second electrode 26 includes a second electrode surface 270. The second electrode surface 270 includes the first part 72 and a second part 274. The second part 274 includes extending portions 276 extending from the first part 72 in the second direction D2. The extending portions 276 are spaced apart from each other in the third direction D3.

The extending portions 276 respectively have second lengths L22 defined in the second direction D2. In the present embodiment, each of the second lengths L22 of the extending portions 276 is longer than a minimum distance L23 between the first electrode surface 68 and the second electrode surface 270 in the second direction D2. However, at least one of the second lengths L22 of the extending portions 276 can be longer than the minimum distance L23 between the first electrode surface 68 and the second electrode surface 270 in the second direction D2. At least one of the second lengths L22 of the extending portions 276 can be substantially equal to or shorter than the minimum distance L23.

In the present embodiment, the extending portions 276 include a first extending portion 276*a*, a second extending portion 276*b*, and third extending portions 276*c*. The third extending portions 276*c* are provided between the first extending portion 276*a* and the second extending portion 276*b* in the third direction D3. However, the extending portions 276 can include at least one of the third extending portions 276*c*.

The first extending portion 276*a* extends from the first part 72 in the second direction D2. The second extending portion 276*b* extends from the first part 72 in the second direction D2. The third extending portions 276*c* extend from the first part 72 in the second direction D2. The first extending portion 276*a*, the second extending portion 276*b*, and the third extending portions 276c are spaced apart from each other in the third direction D3.

The first extending portion 276a has a first width W21 defined in the third direction D3. The second extending portion 276b has a second width W22 defined in the third direction D3. The third extending portions 276c have a third width W23 defined in the third direction D3. The third width W23 is larger than the first width W21 and the second width W22. The first width W21 and the second width W22 are smaller than a maximum distance L24 between adjacent two of the extending portions 276 in the third direction D3. The third width W23 is substantially equal to the maximum distance L24. However, at least one of the first width W21 and the second width W22 can be substantially equal to or larger than the maximum distance L24. The third width W23 can be different from the maximum distance L24.

Third Embodiment

A light emitting device 310 in accordance with a third embodiment will be described below referring to FIG. 9. The light emitting device 310 has substantially the same structure as the light emitting device 10 except for the second electrode surface 70 and the first contact surfaces 48. Thus, elements having substantially the same function as those in the above embodiments will be numbered the same here, and detail descriptions and/or illustrations may be omitted here for the sake of brevity.

Figure 9:
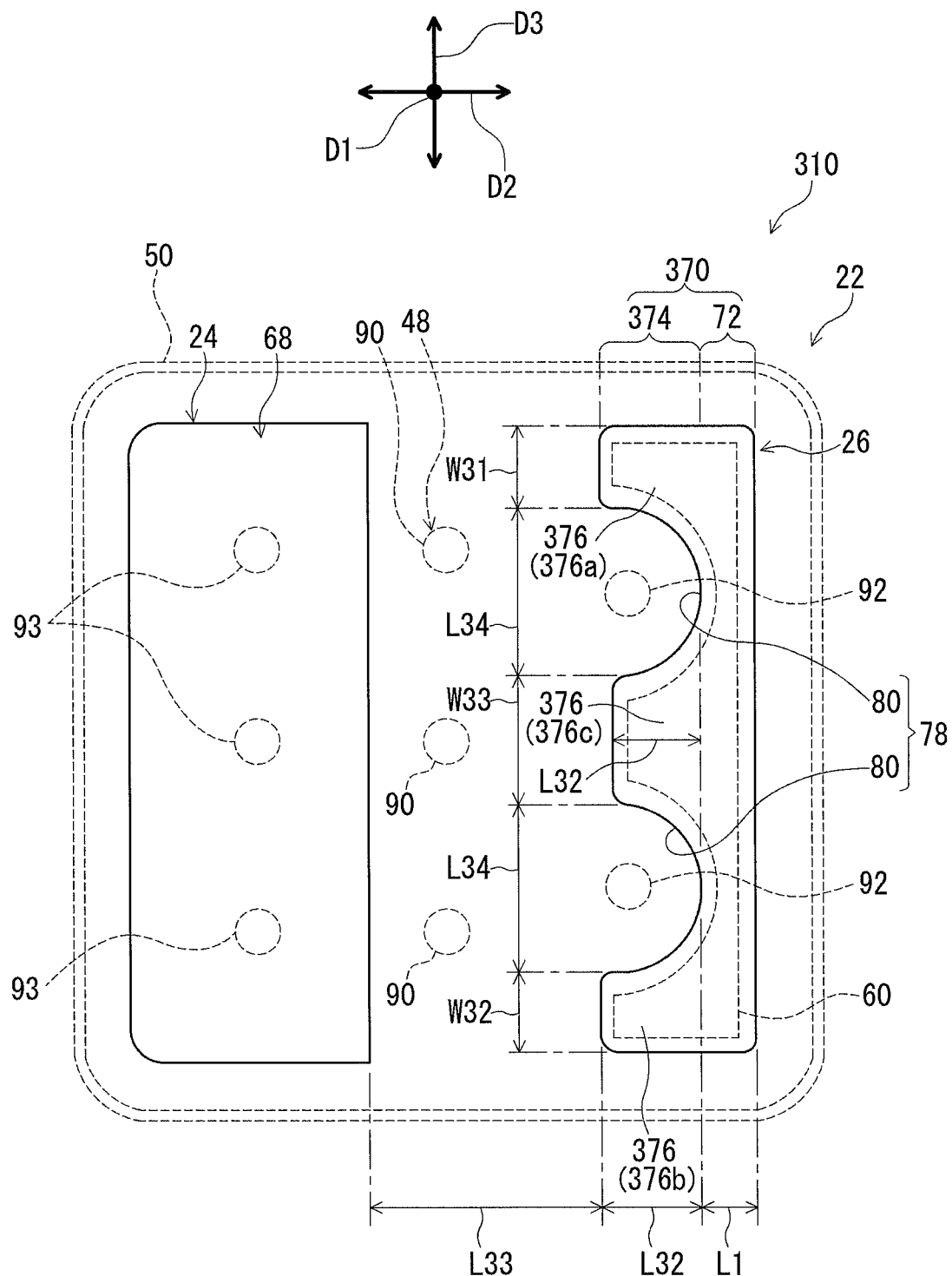
FIG. 9 is a schematic partial plan view of a light emitting device in accordance with a third embodiment.

As seen in FIG. 9, in the light emitting device 310, the second electrode 26 includes a second electrode surface 370. The second electrode surface 370 includes the first part 72 and a second part 374. The second part 374 includes extending portions 376 extending from the first part 72 in the second direction D2. The extending portions 376 are spaced apart from each other in the third direction D3.

The extending portions 376 respectively have second lengths L32 defined in the second direction D2. It is possible that each of the lengths L32 is the same, and it is also possible that each of the lengths L32 are different from each other. Further, it is also possible that some of the lengths L32 are the same and the other are different. At least one of the second lengths L32 of the extending portions 376 is shorter than a minimum distance L33 between the first electrode surface 68 and the second electrode surface 370 in the second direction D2. In the present embodiment, each of the second lengths L32 of the extending portions 376 is shorter than the minimum distance L33 between the first electrode surface 68 and the second electrode surface 370 in the second direction D2. However, at least one of the second lengths L32 can be substantially equal to or longer than the minimum distance L33.

In the present embodiment, the extending portions 376 include a first extending portion 376a, a second extending portion 376b, and a third extending portion 376c. The third extending portion 376c is provided between the first extending portion 376a and the second extending portion 376b in the third direction D3.

The first extending portion 376a extends from the first part 72 in the second direction D2. The second extending portion 376b extends from the first part 72 in the second direction D2. The third extending portion 376c extends from the first part 72 in the second direction D2. The first extending portion 376a, the second extending portion 376b, and the third extending portion 376c are spaced apart from each other in the third direction D3.

The first extending portion 376a has a first width W31 defined in the third direction D3. The second extending portion 376b has a second width W32 defined in the third direction D3. The third extending portion 376c has a third width W33 defined in the third direction D3. The third width W33 is larger than the first width W31 and the second width W32. The first width W31, the second width W32, and the third width W33 are smaller than a maximum distance L34 between adjacent two of the extending portions 376 in the third direction D3.

Fourth Embodiment

A light emitting device 410 in accordance with a fourth embodiment will be described below referring to FIG. 10. The light emitting device 410 has substantially the same structure as the light emitting device 10 except for the second electrode surface 70 and the first contact surfaces 48. Thus, elements having substantially the same function as those in the above embodiments will be numbered the same here, and detail descriptions and/or illustrations may be omitted here for the sake of brevity.

Figure 10:
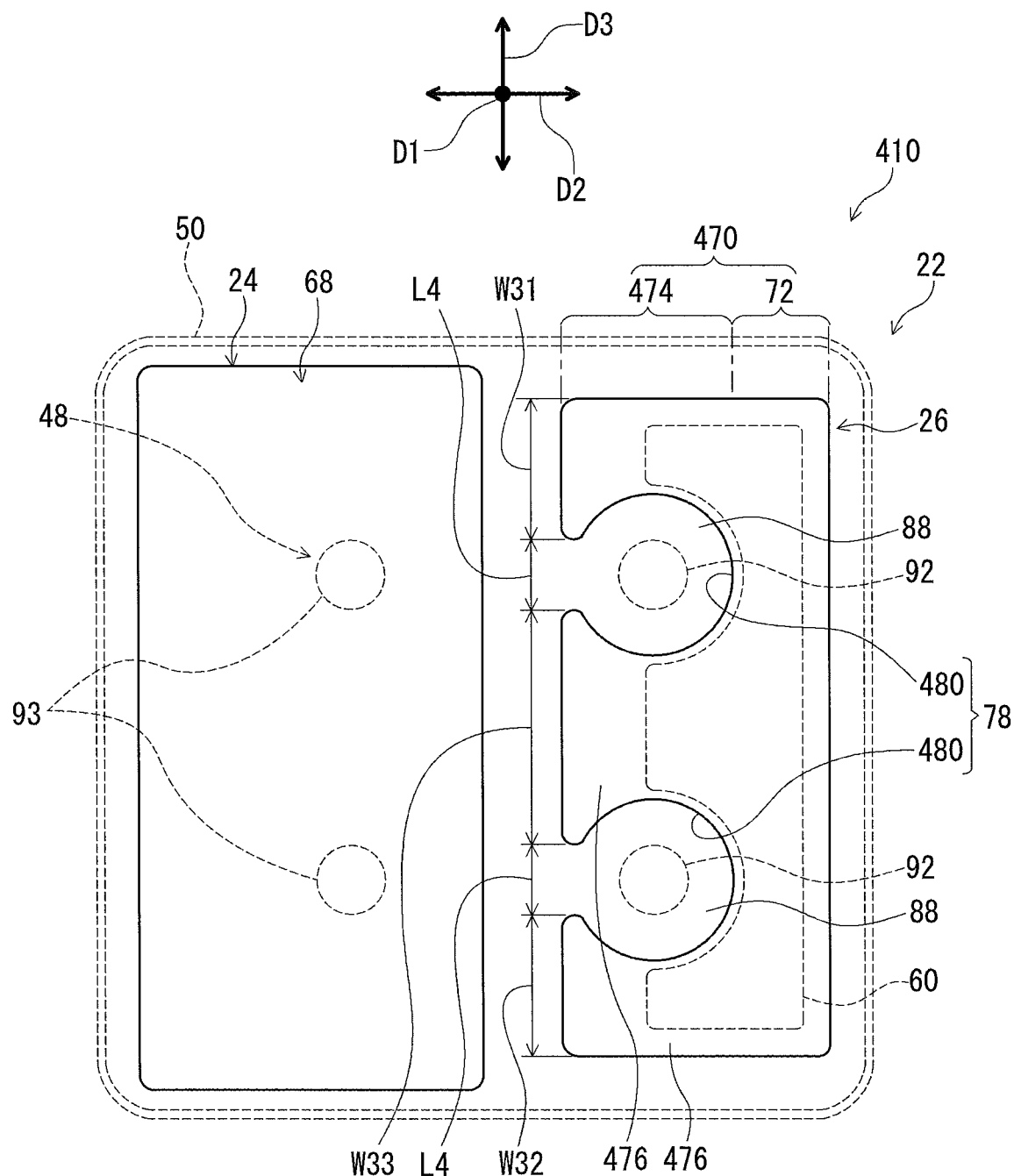
FIG. 10 is a schematic partial plan view of a light emitting device in accordance with a fourth embodiment.

As seen in FIG. 10, in the light emitting device 410, the second electrode 26 includes a second electrode surface 470. The second electrode surface 470 includes the first part 72 and a second part 474. The second part 474 includes extending portions 476 extending from the first part 72 in the second direction D2. The extending portions 476 are spaced apart from each other in the third direction D3.

In the present embodiment, the second electrode surface 470 includes curved edges 480 defining the curved profile 78. Each of the curved edges 480 extends from the first part 72. The curved edges 480 are provided between adjacent two of the extending portions 476. However, the second electrode surface 470 can include at least one curved edge 480 defining at least part of the curved profile 78 and extending from the first part 72.

The curved edge 480 substantially defines a circular shape. Each of the intermediate areas 88 includes a substantially round end defined by the curved edge 480. The curved edge 480 substantially surrounds an area of the second contact part 92 of the first contact surface 48.

As shown in FIG. 10, the extending portion 476 has a first width W31, a second width W32, and a third width W33 which are defined in the third direction D3. The third width W33 is larger than the first width W31 and the second width W32. The first width W31, the second width W32, and the third width W33 are larger than the maximum distance L34 between adjacent two of the extending portions 476 in the third direction D3.

Fifth Embodiment

A light emitting device 510 in accordance with a fifth embodiment will be described below referring to FIG. 11. The light emitting device 510 has substantially the same structure as the light emitting device 10 except for the second electrode surface 70 and the first contact surfaces 48. Thus, elements having substantially the same function as those in the above embodiments will be numbered the same here, and detail descriptions and/or illustrations may be omitted here for the sake of brevity.

Figure 11:
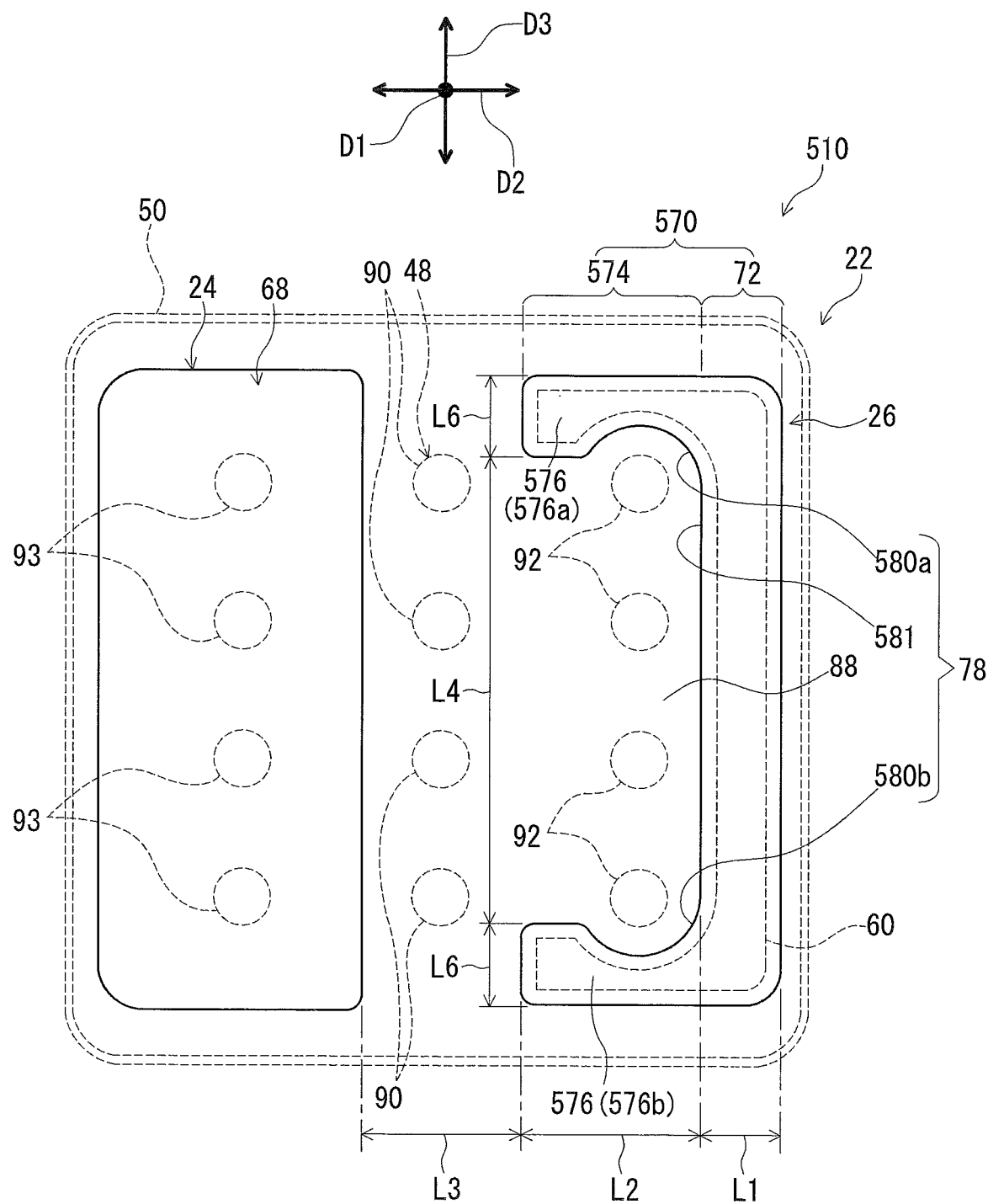
FIG. 11 is a schematic partial plan view of a light emitting device in accordance with a fifth embodiment.

As seen in FIG. 11, in the light emitting device 510, the second electrode 26 includes a second electrode surface 570. The second electrode surface 570 includes the first part 72 and a second part 574. The second part 574 includes extending portions 576 extending from the first part 72 in the second direction D2. The extending portions 576 are spaced apart from each other in the third direction D3.

The extending portions 576 includes a first extending portion 576a and a second extending portion 576b. The first contact parts 90 are provided between the first extending portion 576a and the second extending portion 576b in the third direction D3.

The second electrode surface 570 includes at least one curved edge 580 defining at least part of the curved profile 78 and extending from the first part 72. The at least one curved edge 580 is provided between adjacent two of the extending portions 576.

The second electrode surface 570 includes curved edges 580a and 580b. The curved edges 580a and 580b are coupled to an intermediate edge 581 having a straight shape. The intermediate area 88 includes a substantially round end defined by the curved edges 580a and 580b. In the present embodiment, the substantially round end of the intermediate area 588 is defined by the curved edges 580a and 580b and the intermediate edge 581.

Sixth Embodiment

A light emitting device 610 in accordance with a sixth embodiment will be described below referring to FIGS. 12 and 13. The light emitting device 610 has substantially the same structure as the light emitting device 10 except for the second electrode surface 70 and the first contact surfaces 48. Thus, elements having substantially the same function as those in the above embodiments will be numbered the same here, and detail descriptions and/or illustrations may be omitted here for the sake of brevity.

Figure 12:
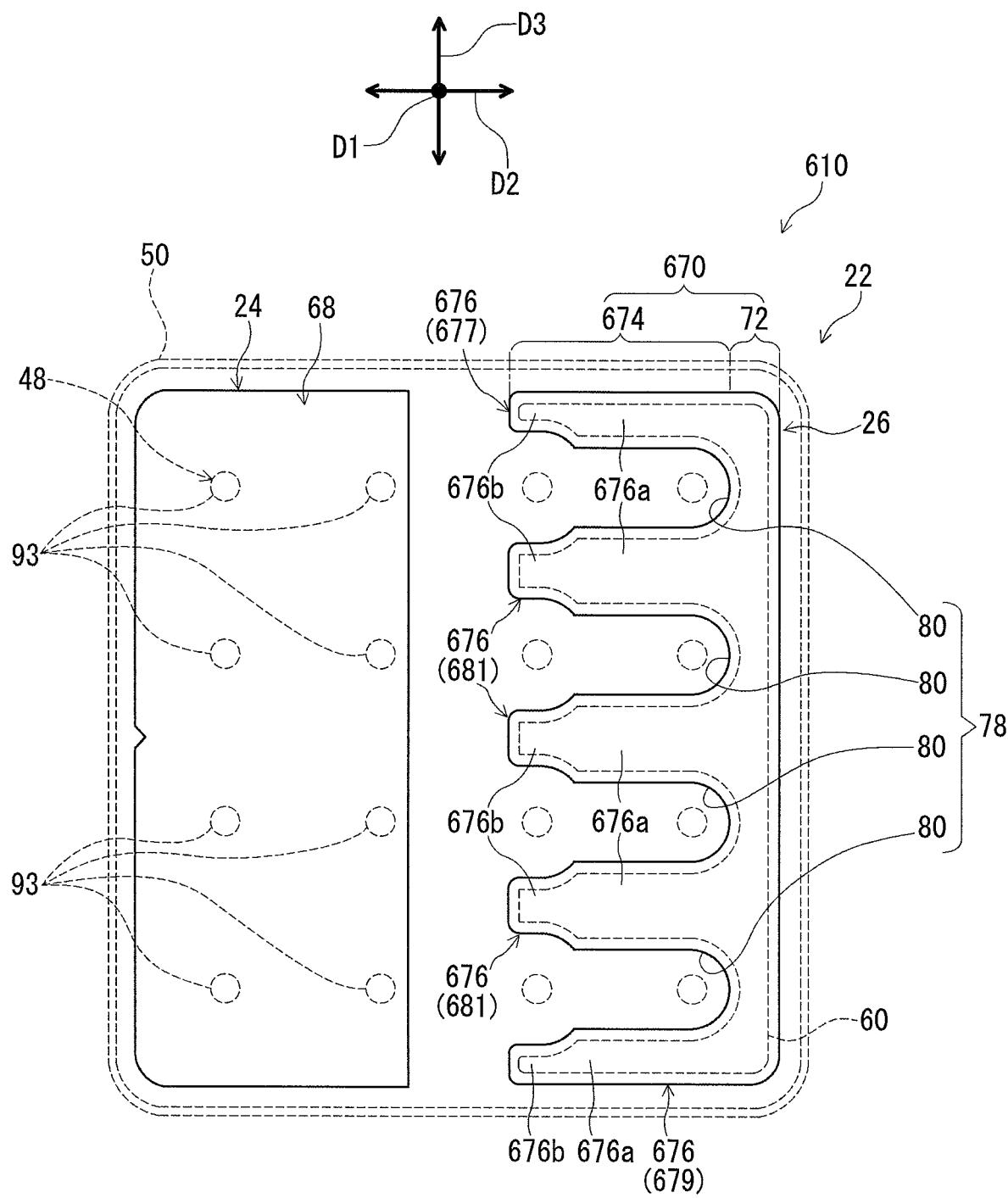
FIG. 12 is a schematic partial plan view of a light emitting device in accordance with a sixth embodiment.

As seen in FIG. 12, in the light emitting device 610, the second electrode 26 includes a second electrode surface 670. The second electrode surface 670 includes the first part 72 and a second part 674. The second part 674 includes extending portions 676 extending from the first part 72 in the second direction D2. The extending portions 676 are spaced apart from each other in the third direction D3.

The second electrode surface 670 has a shape substantially the same as a shape of the second electrode surface 270 in the second embodiment. However, in the present embodiment, at least one of the extending portions 676 includes a first width portion 676a and a second width portion 676b. In the present embodiment, each of the extending portions 676 includes the larger width portion 676a and the smaller width portion 676b.

The larger width portion 676a has a width W64 defined in the third direction D3. The smaller width portion 676b has a width W65 defined in the third direction D3. The width W64 is larger than the width W65 in each of the extending portions 676. In the present embodiment, each of the larger width portion 676a and the smaller width portion 676b is provided at a position other than the curved edge 80.

Figure 13:
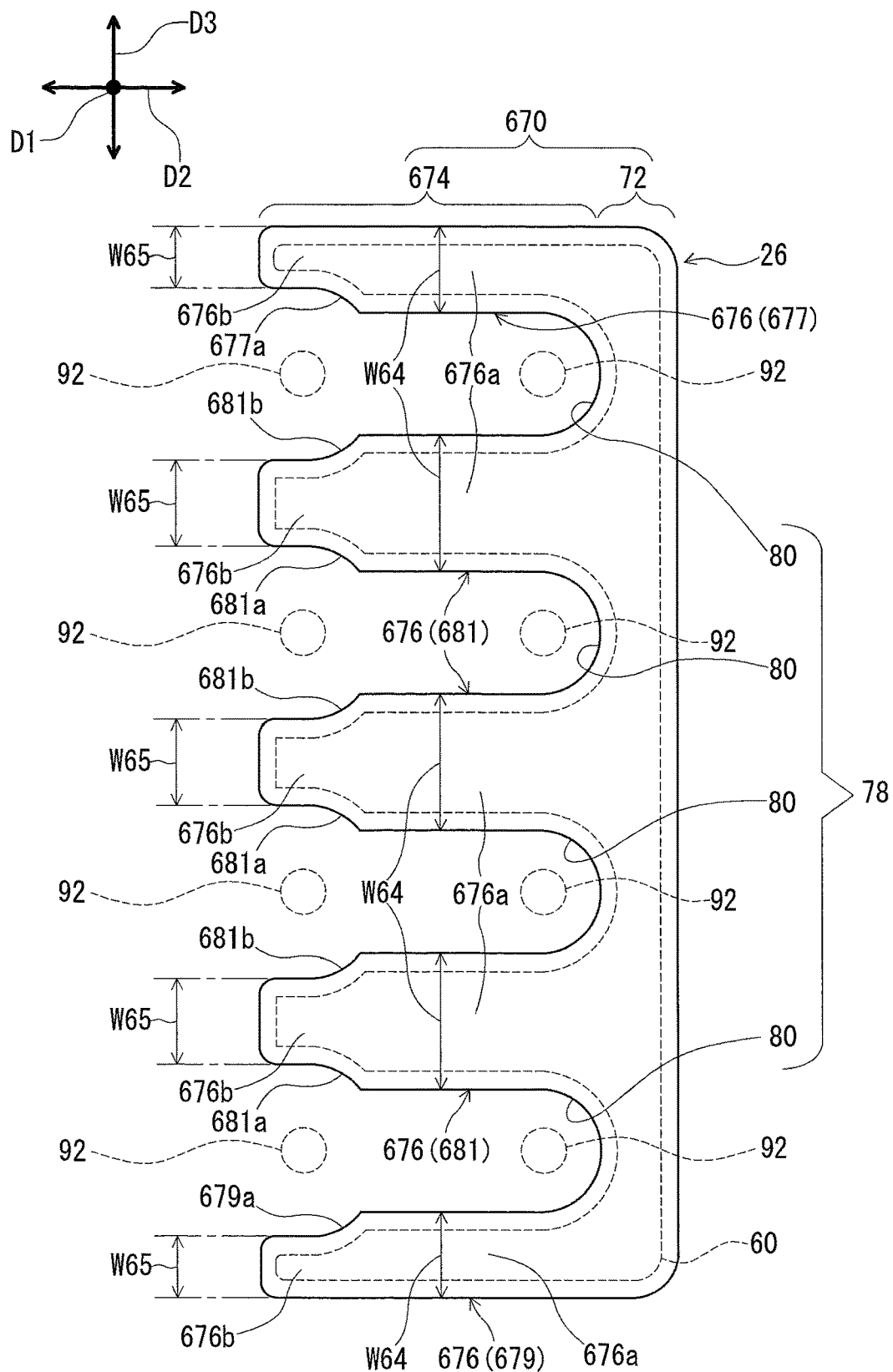
FIG. 13 is a schematic partial enlarged plan view of the light emitting device illustrated in FIG. 12.

As seen in FIG. 13, the extending portions 676 include a first extending portion 677, a second extending portion 679, and third extending portions 681. The third extending portions 681 are provided between the first extending portion 677 and the second extending portion 679 in the third direction D3. The first extending portion 677 includes an additional curved edge 677a provided at the smaller width portion 676b. The second extending portion 679 includes an additional curved edge 679a provided at the smaller width portion 676b. Each of the third extending portions 681 includes additional curved edges 681a and 681b provided at the smaller width portion 676b.

Seventh Embodiment

A light emitting device 710 in accordance with a seventh embodiment will be described below referring to FIGS. 14 and 15. The light emitting device 710 has substantially the same structure as the light emitting device 10 except for the second electrode surface 70 and the first contact surfaces 48. Thus, elements having substantially the same function as those in the above embodiments will be numbered the same here, and detail descriptions and/or illustrations may be omitted here for the sake of brevity.

Figure 14:
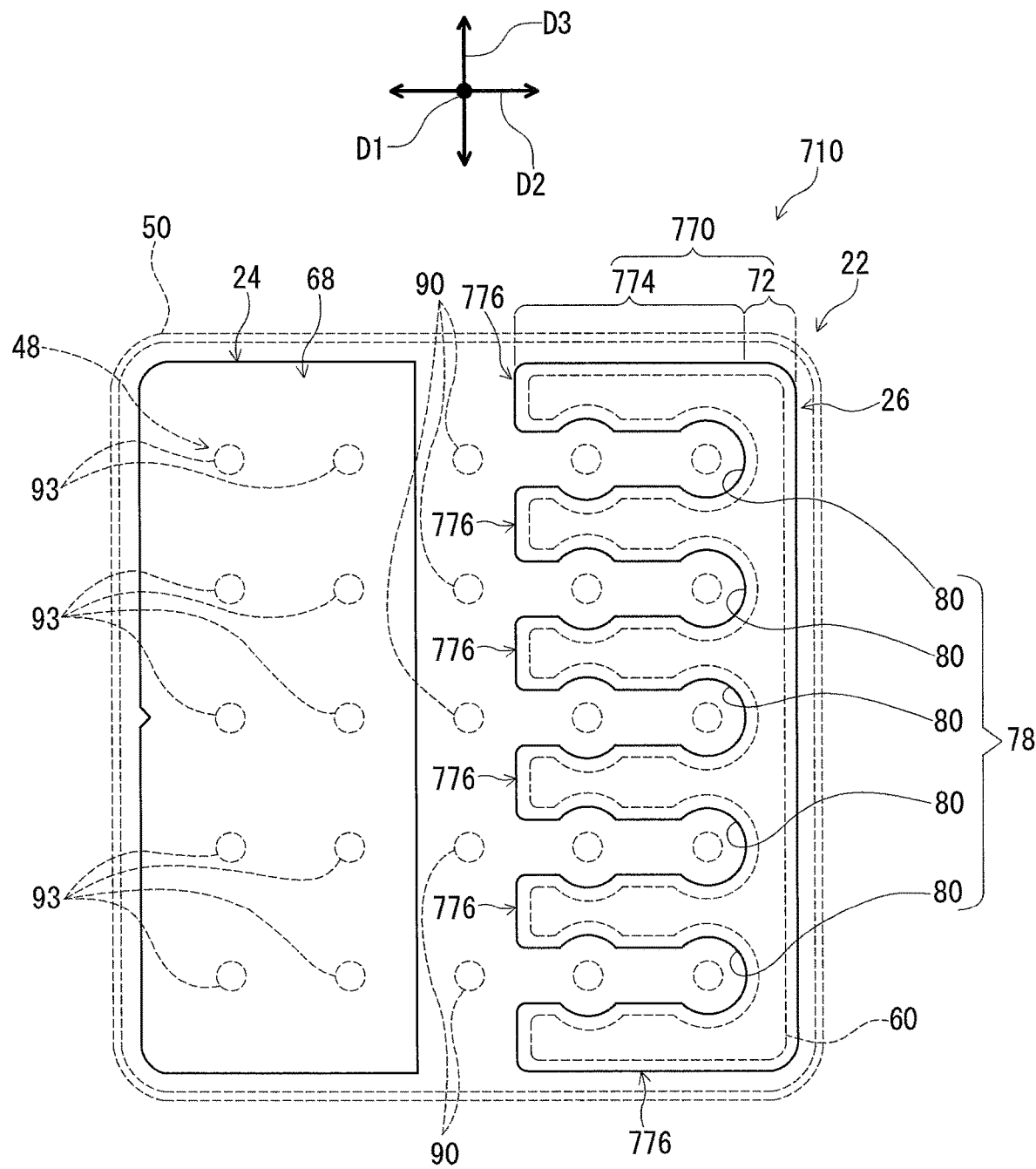
FIG. 14 is a schematic partial plan view of a light emitting device in accordance with a seventh embodiment.

As seen in FIG. 14, in the light emitting device 710, the second electrode 26 includes a second electrode surface 770. The second electrode surface 770 includes the first part 72 and a second part 774. The second part 774 includes extending portions 776 extending from the first part 72 in the second direction D2. The extending portions 776 are spaced apart from each other in the third direction D3.

Figure 15:
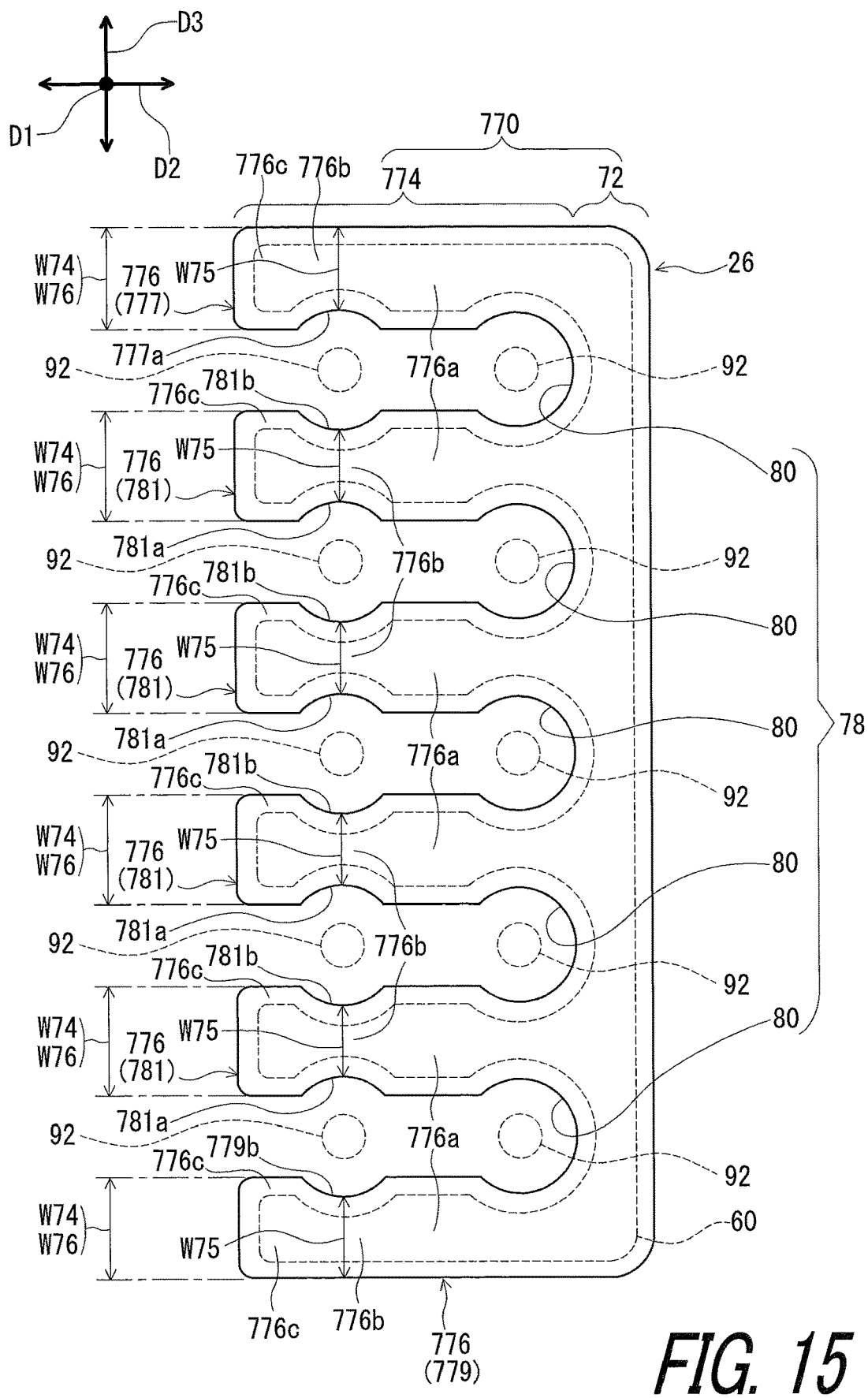
FIG. 15 is a schematic partial enlarged plan view of the light emitting device illustrated in FIG. 14.

As seen in FIG. 15, the second electrode surface 770 has a shape substantially equal to a shape of the second electrode surface 670 in the sixth embodiment. However, in the present embodiment, at least one of the extending portions 776 includes a larger width portion 776a, a smaller width portion 776b, and an additional larger width portion 776c. The smaller width portion 776b is provided between the larger width portion 776a and the additional larger width portion 776c in the second direction D2.

The larger width portion 776a has a width W74 defined in the third direction D3. The smaller width portion 776b has a width W75 defined in the third direction D3. The width W74 is larger than the width W75. The additional larger width portion 776a has a W76 defined in the third direction D3. The width W76 is substantially equal to the width W74 and is larger than the width W75.

In other words, the extending portions 776 include a first extending portion 777, a second extending portion 779, and third extending portions 781. The third extending portions 781 are provided between the first extending portion 777 and the second extending portion 779 in the third direction D3. The first extending portion 777 includes an additional curved edge 777a provided at the smaller portion 776b. The second extending portion 779 includes an additional curved edge 779a provided at the smaller width portion 776b. Each of the third extending portions 781 includes additional curved edges 781a and 781b provided at the smaller portion 776b.

Eighth Embodiment

A light emitting device 810 in accordance with an eighth embodiment will be described below referring to FIG. 16. The light emitting device 810 has substantially the same structure as the light emitting device 10 except for the second electrode surface 70, the first contact surfaces 48 and second contact surface 60. Thus, elements having substantially the same function as those in the above embodiments will be numbered the same here, and detail descriptions and/or illustrations may be omitted here for the sake of brevity.

Figure 16:
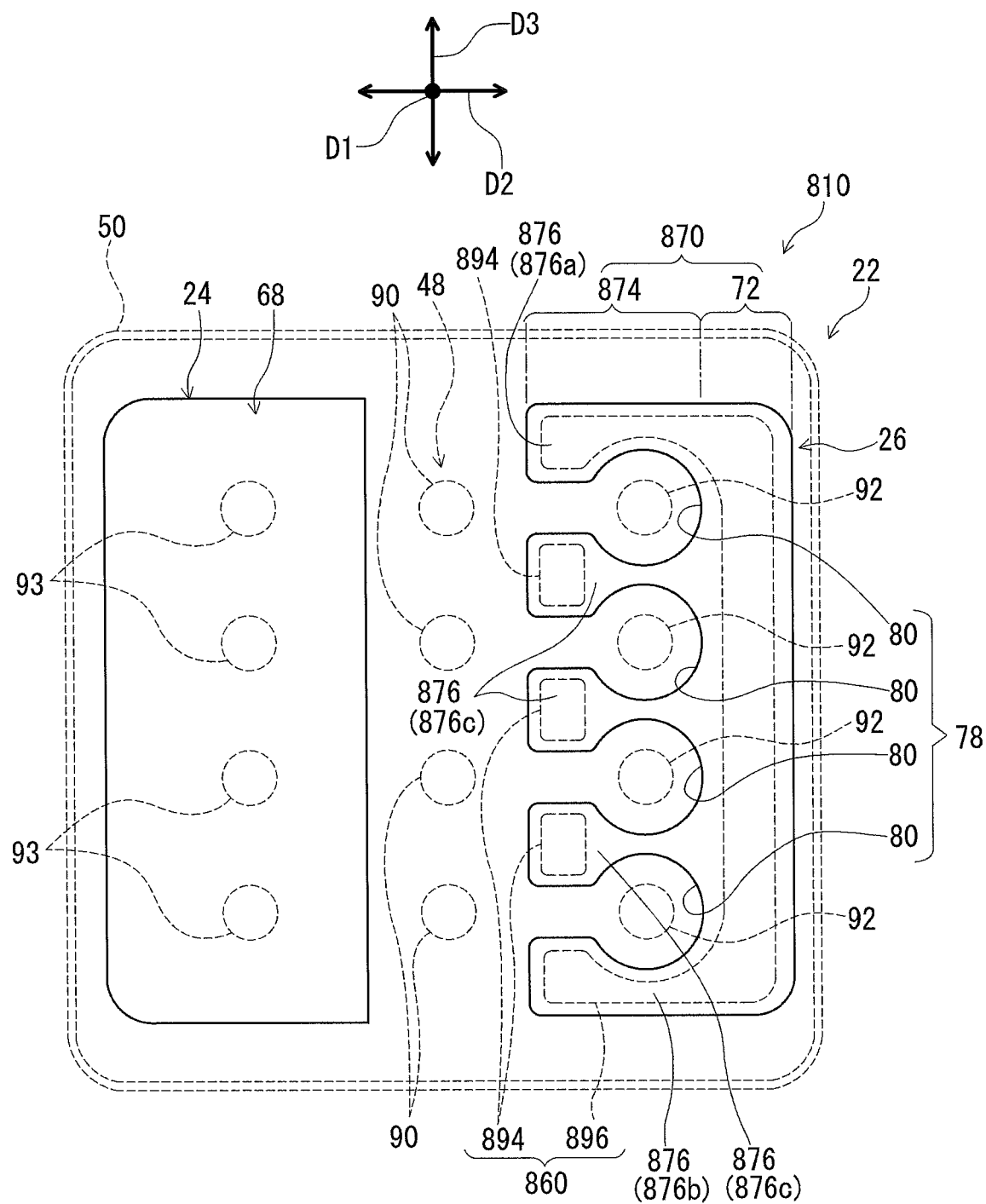
FIG. 16 is a schematic partial plan view of a light emitting device in accordance with an eighth embodiment.

As seen in FIG. 16, in the light emitting device 810, the second electrode 26 includes a second electrode surface 870. The second electrode surface 870 includes the first part 72 and a second part 874. The second part 874 includes extending portions 876 extending from the first part 72 in the second direction D2. The extending portions 876 are spaced apart from each other in the third direction D3.

In the present embodiment, the extending portions 876 includes a first extending portion 876a, a second extending portion 876b, and third extending portions 876c. The third extending portions 876c are provided between the first extending portion 876a and the second extending portion 876b in the third direction D3.

The second electrode 26 includes a second contact surface 860 contacting the second additional electrode 58 (FIG. 5). The second part 74 overlaps with an area of the second contact surface 860 when viewed from the first direction D1. The second contact surface 860 includes third contact parts 894 contacting the second additional electrode 58 (FIG. 5). The third contact parts 894 are arranged in the third direction D3 so as to be spaced apart from each other. The second part 874 overlaps with areas of the third contact parts 894 when viewed from the first direction D1. The extending portions 876 overlap with the areas of the third contact parts 894 when viewed from the first direction D1. The third extending portions 876c respectively overlap with the areas of the third contact parts 894 when viewed from the first direction D1. The second contact surface 860 can include at least one third contact part 894 contacting the second additional electrode 58.

The second contact surface 860 includes a fourth contact part 896 contacting the second additional electrode 58 (FIG. 5). The fourth contact part 896 is spaced apart from the third contact part 894, so that a shape of the second contact surface 860 is different from a shape of the second electrode surface 870. The first part 72 overlaps with an area of the fourth contact part 896 when viewed from the first direction D1. The first part 72 and two of the extending portions 876 overlap with the area of the fourth contact part 896 when viewed from the first direction D1. Specifically, the first part 72, the first extending portion 876a, and the second extending portion 876b overlap with the area of the fourth contact part 896 when viewed from the first direction D1.

Ninth Embodiment

A light emitting device 910 in accordance with a ninth embodiment will be described below referring to FIG. 17. The light emitting device 910 has the substantially the same structure as the light emitting device 810 of the eighth embodiment except for the second electrode surface 70 and second contact surface 60. Thus, elements having substantially the same function as those in the above embodiments will be numbered the same here, and detail descriptions and/or illustrations may be omitted here for the sake of brevity.

Figure 17:
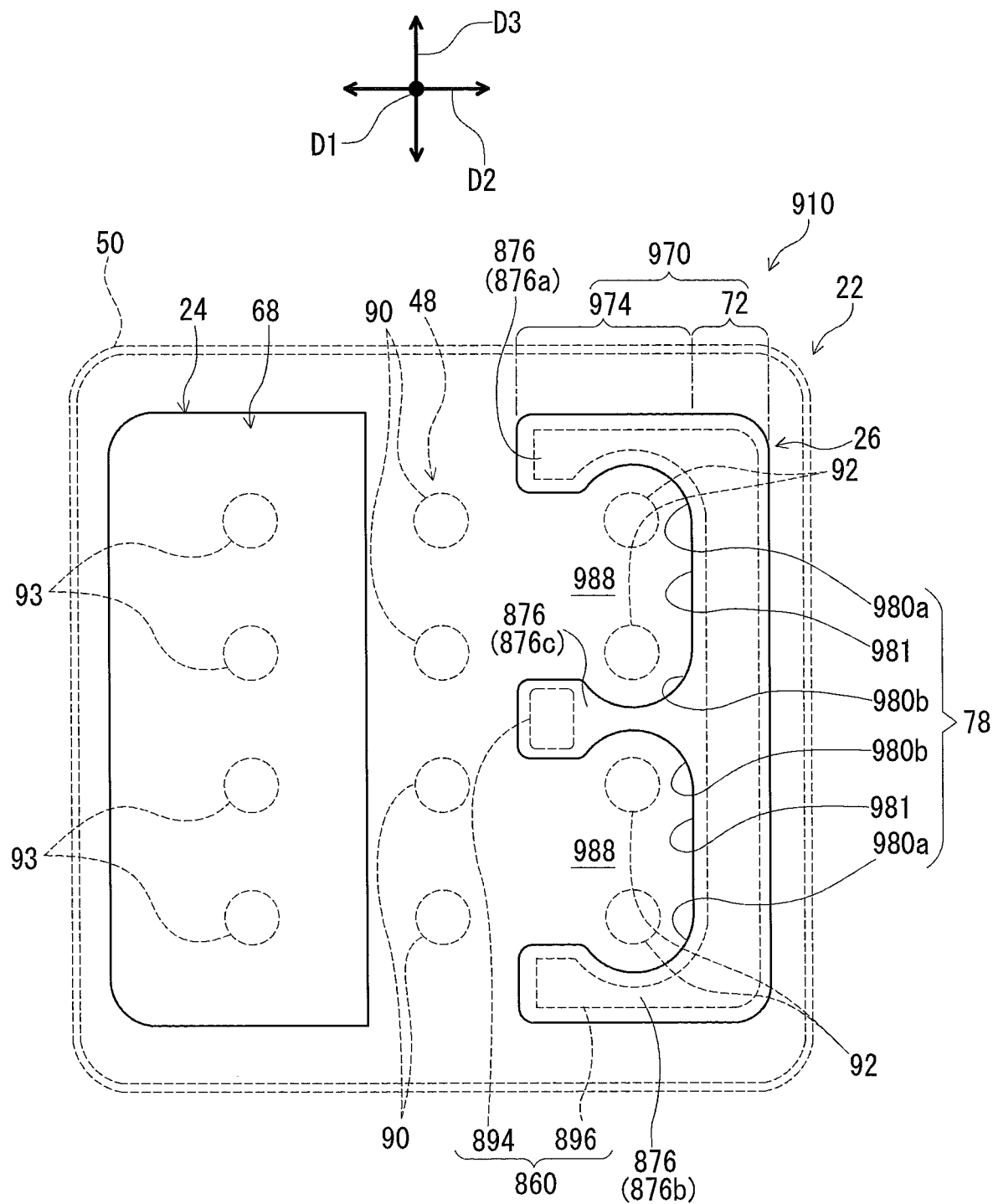
FIG. 17 is a schematic partial plan view of a light emitting device in accordance with a ninth embodiment.

As seen in FIG. 17, in the light emitting device 910, the second electrode 26 includes a second electrode surface 970. The second electrode surface 970 includes the first part 72 and a second part 974. The second part 974 includes the extending portions 876 extending from the first part 72 in the second direction D2. In the present embodiment, the extending portions 876 includes the first extending portion 876a, the second extending portion 876b, and the third extending portion 876c.

The second contact surface 860 includes the third contact part 894 contacting the second additional electrode 58. The second part 974 overlaps with the area of the third contact part 894 when viewed from the first direction D1. The third extending portion 876c overlaps with the area of the third contact part 894 when viewed from the first direction D1. The first part 72, the first extending portion 876a, and the second extending portion 876b overlap with the area of the fourth contact part 896 when viewed from the first direction D1.

The second electrode surface 570 includes curved edges 980a and 980b. The curved edges 980a and 980b are coupled to an intermediate edge 981 having a straight shape. Each of intermediate areas 988 of the second base surface 16 includes a substantially round end defined by the curved edges 980a and 980b. In the present embodiment, the substantially round end of the intermediate area 988 is defined by the curved edges 980a and 980b and the intermediate edge 981.

Tenth Embodiment

A light emitting device 1010 in accordance with a ninth embodiment will be described below referring to FIG. 18. The light emitting device 1010 has substantially the same structure as the light emitting device 810 of the eighth embodiment except for a total number of the light emitting element and wavelength conversion member 1012a and 1012b. Thus, elements having substantially the same function as those in the above embodiments will be numbered the same here, and detail descriptions and/or illustrations may be omitted here for the sake of brevity.

Figure 18:
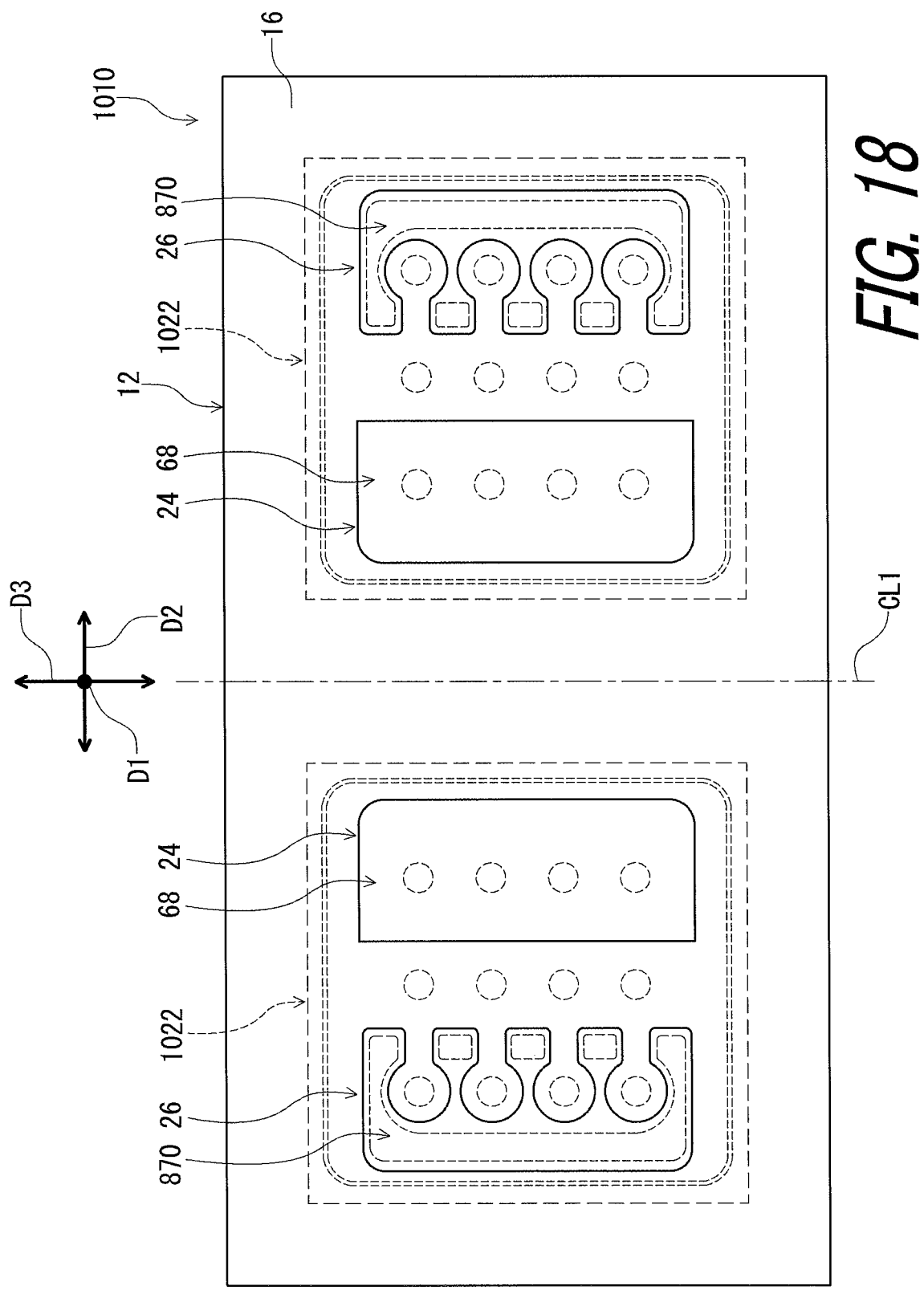
FIG. 18 is a schematic plan view of a light emitting device in accordance with a tenth embodiment.
Figure 19:
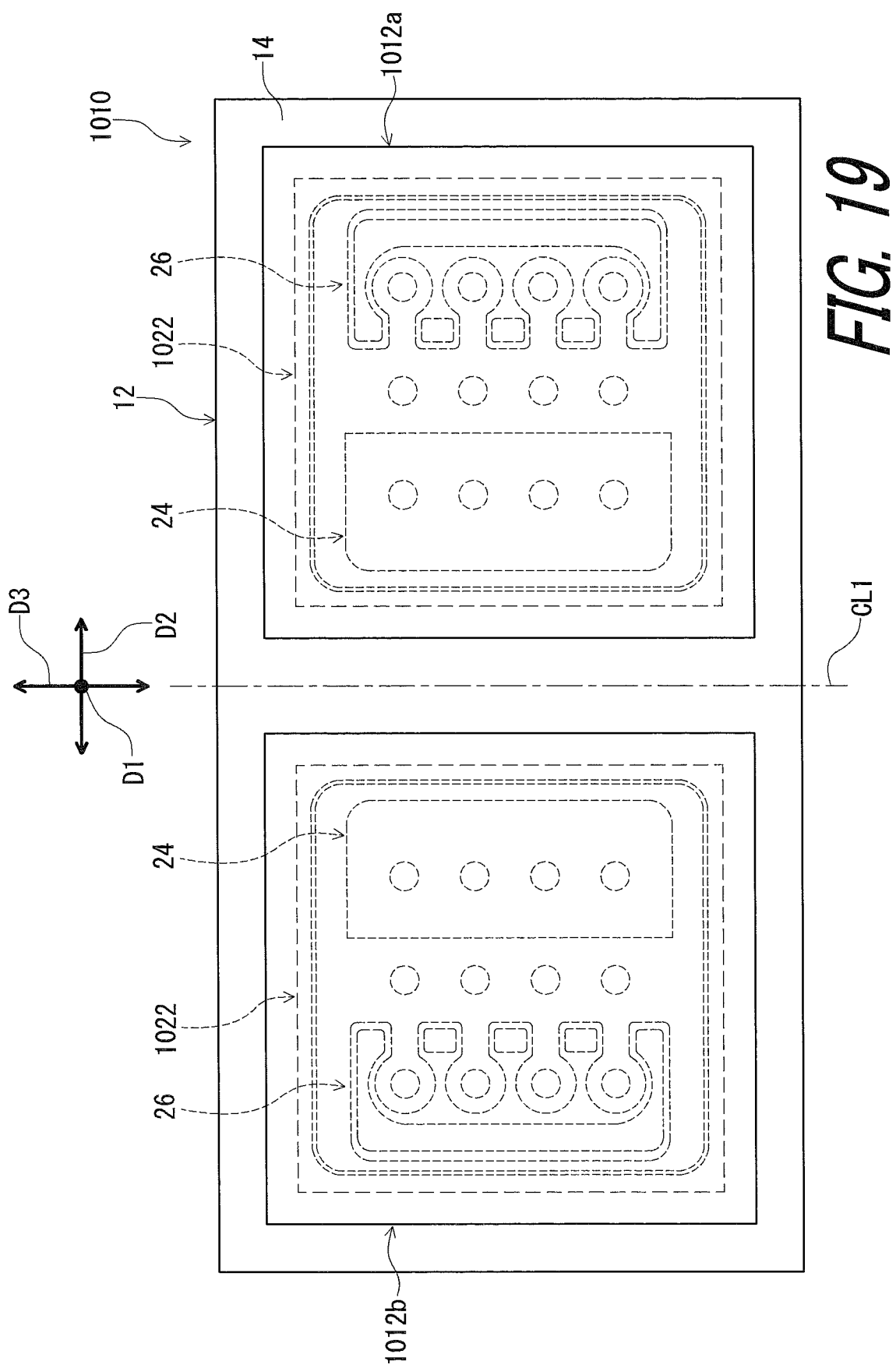
FIG. 19 is a schematic plan view of the light emitting device in accordance with the tenth embodiment.

As seen in FIG. 18, the light emitting device 1010 include two light emitting elements 1022 having a structure substantially the same as a structure of the light emitting element 22 (FIG. 16) of the light emitting device 810 in accordance with the eight embodiment. The light emitting elements 1022 are symmetrically provided with respect to a line CL1. A total number of the light emitting elements 1022 is not limited to the present embodiments.

Further, the light emitting device 1010 includes wavelength conversion members 1012a and 1012b respectively disposed on the two light emitting element 1022. The wavelength conversion members 1012a and 1012b include phosphor of different kinds from each other so as to obtain light emission colors which are different from each other, for example, white and amber.

Eleventh Embodiment

A light emitting device 1110 in accordance with an eleventh embodiment will be described below referring to FIG. 20. The light emitting device 1110 has substantially the same structure as the light emitting device 310 of the third embodiment except for the first contact surfaces 48. Thus, elements having substantially the same function as those in the first embodiment will be numbered the same here, and detail descriptions and/or illustrations may be omitted here for the sake of brevity.

Figure 20:
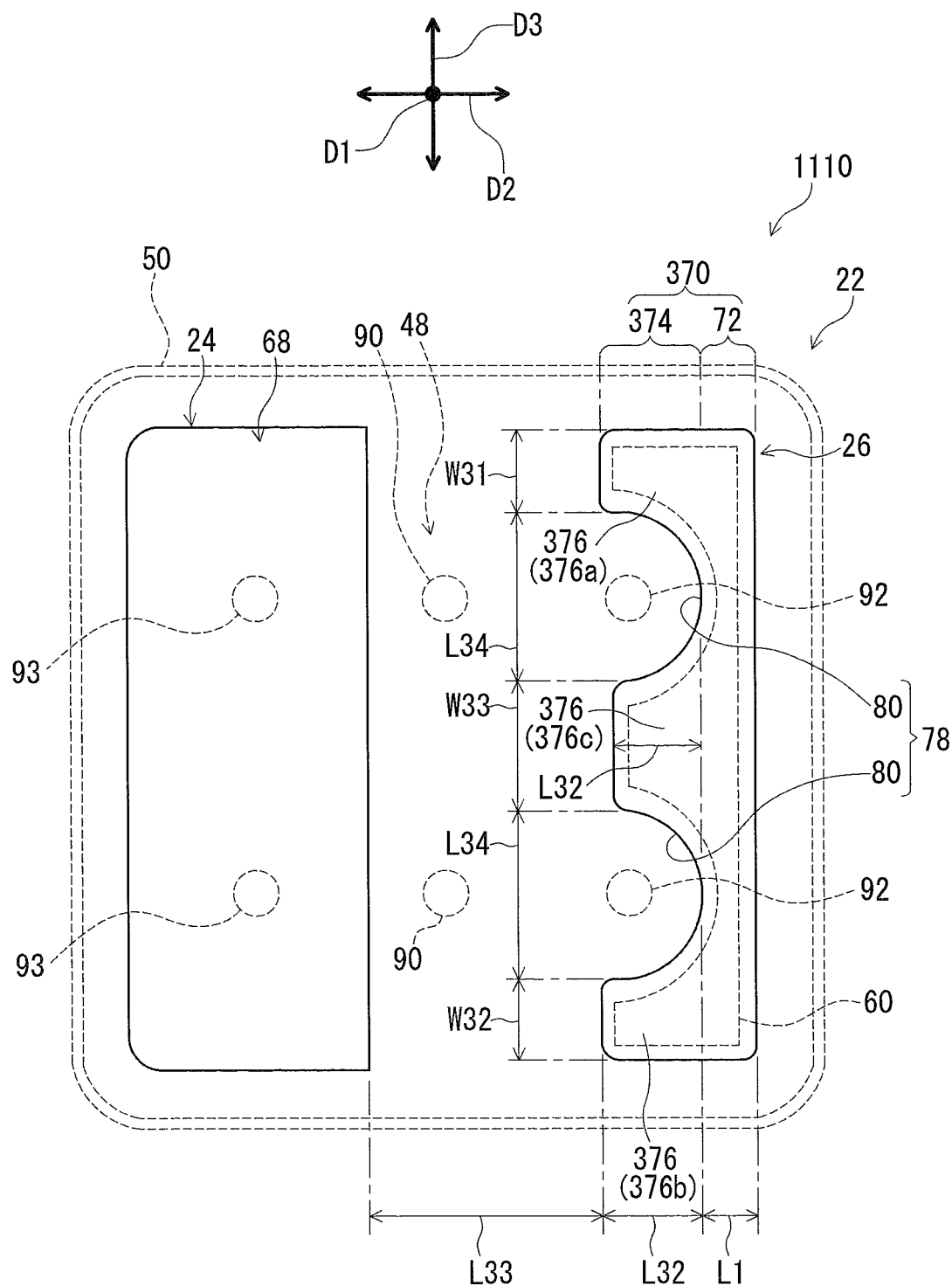
FIG. 20 is a schematic partial plan view of a light emitting device in accordance with an eleventh embodiment.

As seen in FIG. 20, the first contact surface 48 includes first contact parts 90, second contact parts 92 and first additional contact parts 93. The first contact parts 90 are substantially aligned with each other in the third direction D3. The second contact parts 92 are substantially aligned with each other in the third direction D3. The first additional contact parts 93 are substantially aligned with each other in the third direction D3. A total number (e.g., two) of the second contact parts 92 is the same as a total number (e.g., two) of the first contact parts 90 and a total number (e.g., two) of the first additional contact parts 93.

It will be apparent to those skilled in the field of the light emitting device from the present disclosure that the structures of the above embodiments can be at least partially combined with each other.

In the present application, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. This concept also applies to words of similar meaning, for example, the terms "have", "include" and their derivatives.

The terms "member", "section", "portion", "part", "element", "body" and "structure" when used in the singular can have the dual meaning of a single part or a plurality of parts.

The ordinal numbers such as "first" and "second" recited in the present application are merely identifiers, but do not have any other meanings, for example, a particular order and the like. Moreover, for example, the term "first element" itself does not imply an existence of "second element", and the term "second element" itself does not imply an existence of "first element."

The term "pair of", as used herein, can encompass the configuration in which the pair of elements have different shapes or structures from each other in addition to the configuration in which the pair of elements have the same shapes or structures as each other.

Finally, terms of degree such as "substantially", "about" and "approximately" as used herein mean a reasonable amount of deviation of the modified term such that the end result is not significantly changed.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
    a base structure including a first base surface and a second base surface opposite to the first base surface in a first direction, wherein the base structure includes a base member; and
    a light emitting element configured to emit light, the light emitting element comprising:
    a first electrode including a first electrode surface exposed from the second base surface to an outside of the light emitting device; and
    a second electrode separately provided from the first electrode, wherein the base member includes an intermediate portion provided between the first electrode and the second electrode, wherein the second electrode includes a second electrode surface, wherein the second electrode surface is spaced apart from the first electrode surface in a second direction different from the first direction, the second electrode surface comprising:
    a first part extending longitudinally in a third direction different from each of the first direction and the second direction, the first part of the second electrode surface extends within an opening on the second base surface to be exposed from the second base surface to the outside of the light emitting device; and
    a second part extending longitudinally from the first part in the second direction, at least part of the second part having a curved profile extending from the first part when viewed in the first direction, the second part of the second electrode surface extends within the opening on the second base surface to be exposed from the second base surface to the outside of the light emitting device,
    wherein the base member forms the second base surface, and wherein the base member at the second base surface includes a light reflection material to reflect light emitted from the light emitting element so that light emitted from the light emitting element is emitted out of the light emitting device through the first base surface,
    wherein the second part extends from the first part toward the first electrode surface in the second direction, and
    wherein the entire first electrode surface has a substantially rectangular shape defined by four sides when viewed in plan view.

2. The light emitting device according to claim 1, wherein the second part includes extending portions extending from the first part in the second direction,
    the extending portions are spaced apart from each other in the third direction,
    the second electrode surface includes at least one curved edge defining at least part of the curved profile and extending from the first part, and
    the at least one curved edge is provided between an adjacent two of the extending portions.

3. The light emitting device according to claim 2, wherein the extending portions extend from the first part toward the first electrode surface in the second direction.

4. The light emitting device according to claim 2, wherein the first part has a first length defined in the second direction,
    the extending portions respectively have second lengths defined in the second direction, and
    at least one of the second lengths is longer than the first length.

5. The light emitting device according to claim 4, wherein at least two of the second lengths of the extending portions are substantially equal to each other.

6. The light emitting device according to claim 4, wherein at least one of the second lengths of the extending portions longer than a minimum distance between the first electrode surface and the second electrode surface in the second direction.

7. The light emitting device according to claim 4, wherein at least one of the second lengths of the extending portions is longer than a maximum distance between adjacent two of the extending portions in the third direction.

8. The light emitting device according to claim 2, wherein the first part has a third length defined in the third direction,
    the extending portions respectively have a plurality of fourth lengths in the third direction, and
    the fourth lengths are shorter than the third length.

9. The light emitting device according to claim 2, wherein the extending portions respectively has fourth lengths in the third direction, and
    the fourth lengths are substantially equal to each other.

10. The light emitting device according to claim 2, wherein
    at least one of the extending portions includes a larger width portion and a smaller width portion,
    the larger width portion has a first width defined in the third direction,
    the smaller width portion has a second width defined in the third direction, and
    the first width of the larger width portion is larger than the second width of the smaller width portion.

11. The light emitting device according to claim 2, wherein
    the extending portions includes a first extending portion, a second extending portion, and at least one third extending portion,
    the at least one third extending portion is provided between the first extending portion and the second extending portion in the third direction,
    the first extending portion has a first width defined in the third direction, the second extending portion has a second width defined in the third direction, the at least one third extending portion has a third width defined in the third direction, and the third width is larger than the first width and the second width.

12. The light emitting device according to claim 1, wherein the first part has a first length defined in the second direction, the second part has a second length defined in the second direction, and the second length is longer than the first length.

13. The light emitting device according to claim 12, wherein the second length is longer than a minimum distance between the first electrode surface and the second electrode surface in the second direction.

14. The light emitting device according to claim 2, wherein the second base surface includes at least one intermediate area provided between the adjacent two of the extending portions in the third direction when viewed from the first direction, and the at least one intermediate area includes a substantially round end defined by the at least one curved edge.

15. The light emitting device according to claim 1, wherein the light emitting element comprises a first semiconductor layer, a light emitting layer, and a second semiconductor layer coupled to the first semiconductor layer via the light emitting layer, the first electrode includes a first contact surface contacting the first semiconductor layer, and the second electrode surface is provided to avoid overlapping with an area of the first contact surface when viewed from the first direction.

16. The light emitting device according to claim 1, wherein the curved profile is spaced apart from the area of the first contact surface when viewed from the first direction.

17. The light emitting device according to claim 16, wherein the second part includes extending portions extending from the first part in the second direction, the extending portions are spaced apart from each other in the third direction, the extending portions are provided to avoid overlapping with an area of the first contact surface when viewed from the first direction, and at least one of the extending portions is arranged to face the area of the first contact surface the second direction when viewed from the first direction.

18. The light emitting device according to claim 16, wherein the first contact surface includes first contact parts and second contact parts, the first contact parts are substantially aligned with each other in the third direction and each contact the first semiconductor layer, the second contact parts are substantially aligned with each other in the third direction and each contact the first semiconductor layer, and a total number of the second contact parts is different from a total number of the first contact parts.

19. The light emitting device according to claim 1, wherein each of the first electrode and the second electrode is partially embedded in the base member.

20. The light emitting device according to claim 19, wherein the base member includes a base portion and a wall protruding from the base portion in the first direction to surround the light emitting element, and the base structure includes a light transmissive member provided between the wall and the light emitting element to cover the light emitting element.

21. The light emitting device according to claim 19, wherein the base structure includes a wavelength conversion member to convert a first wavelength of light emitted from the light emitting element to a second wavelength different from the first wavelength, and the wavelength conversion member is provided on a side opposite to the second base surface relative to the light emitting element.

22. The light emitting device according to claim 1, wherein the base structure includes a first straight side extending in the second direction when viewed from the first direction, and a second straight side extending in the third direction when viewed from the first direction.

23. The light emitting device according to claim 1, wherein the second electrode includes a second electrode body that extends through the base member to the opening to form the second electrode surface.

24. The light emitting device according to claim 23, wherein the first electrode surface extends within an additional opening on the second base surface to be exposed from the second base surface to the outside of the light emitting device, and the first electrode includes a first electrode body that extends through the base member to the additional opening to form the first electrode surface.

25. The light emitting device according to claim 1, wherein the first electrode surface has a substantially constant width in the second direction over an entirety of the first electrode surface.

26. A light emitting device comprising:

a base structure including a first base surface and a second base surface opposite to the first base surface in a first direction, wherein the base structure includes a base member; and a light emitting element configured to emit light, the light emitting element comprising:

a first electrode including a first electrode surface exposed from the second base surface to an outside of the light emitting device; and a second electrode separately provided from the first electrode, wherein the base member includes an intermediate portion provided between the first electrode and the second electrode, wherein the second electrode includes a second electrode surface and a second contact surface, wherein the second electrode surface is spaced apart from the first electrode surface in a second direction different from the first direction, wherein the second contact surface is opposite to the second electrode surface in the first direction, the second electrode surface comprising:

a first part extending longitudinally in a third direction different from each of the first direction and the second direction, the first part of the second electrode surface extends within an opening on the second base surface to be exposed from the second base surface to the outside of the light emitting device; and a second part extending longitudinally from the first part in the second direction, the second part overlapping with an area of the second contact surface when viewed from the first direction, the second part of the second electrode surface extends within an opening on the second base surface to be exposed from the second base surface to the outside of the light emitting device, wherein the base member forms the second base surface, and wherein the base member at the second base surface includes a light reflection material to reflect light emitted from the light emitting element so that light emitted from the light emitting element is emitted out of the light emitting device through the first base surface, wherein the second part extends from the first part toward the first electrode surface in the second direction, and wherein the entire first electrode surface has a substantially rectangular shape defined by four sides when viewed in plan view.

27. The light emitting device according to claim 26, wherein
the light emitting element includes a first semiconductor layer, a light emitting layer, and a second semiconductor layer coupled to the first semiconductor layer via the light emitting layer,
the light emitting element includes a second additional electrode contacting the second semiconductor layer, and
the second contact surface contacts the second additional electrode.

28. The light emitting device according to claim 26, wherein
the second contact surface includes at least one third contact part contacting the second additional electrode, and
the second part overlaps with an area of the at least one third contact part when viewed from the first direction.

29. The light emitting device according to claim 28, wherein
the second part includes extending portions extending from the first part in the second direction,
the extending portions are spaced apart from each other in the third direction, and
at least one of the extending portions overlaps with an area of the at least one third contact part when viewed from the first direction.

30. The light emitting device according to claim 28, wherein
the at least one third contact part includes third contact parts each contacting the second additional electrode, and
the third contact parts are arranged in the third direction.

31. The light emitting device according to claim 28, wherein
the second contact surface includes a fourth contact part contacting the second additional electrode,
the fourth contact part is spaced apart from the at least one third contact part, and
the first part overlaps with an area of the fourth contact part when viewed from the first direction.

32. The light emitting device according to claim 26, wherein
each of the first electrode and the second electrode is partially embedded in the base member.

33. The light emitting device according to claim 32, wherein
the base member includes a base portion and a wall protruding from the base portion in the first direction to surround the light emitting element, and
the base structure includes a light transmissive member provided between the wall and the light emitting element to cover the light emitting element.

34. The light emitting device according to claim 26, wherein
the base structure includes
a first straight side extending in the second direction when viewed from the first direction, and
a second straight side extending in the third direction when viewed from the first direction.

35. A light emitting device comprising:
a base structure including a first base surface and a second base surface opposite to the first base surface in a first direction, wherein the base structure includes a base member; and
a light emitting element configured to emit light, the light emitting element comprising:
a first electrode including a first electrode surface exposed from the second base surface to an outside of the light emitting device; and
a second electrode separately provided from the first electrode surface, wherein the base member includes an intermediate portion provided between the first electrode and the second electrode, wherein the second electrode includes a second electrode surface provided in the second base surface when viewed from the first direction, wherein the second electrode surface is spaced apart from the first electrode surface in a second direction different from the first direction, the second electrode surface comprising:
a first part extending in a third direction different from each of the first direction and the second direction, the first part of the second electrode surface extends within an opening on the second base surface to be exposed from the second base surface to the outside of the light emitting device; and
a second part including extending portions extending from the first part in the second direction, the extending portions being spaced apart from each other in the third direction, each of the extending portions including a first end having a straight edge, the second part of the second electrode surface extends within an opening on the second base surface to be exposed from the second base surface to the outside of the light emitting device,
wherein the base member forms the second base surface, and wherein the base member at the second base surface includes a light reflection material to reflect light emitted from the light emitting element so that light emitted from the light emitting element is emitted out of the light emitting device through the first base surface,
wherein the second part extends from the first part toward the first electrode surface in the second direction, and
wherein the entire first electrode surface has a substantially rectangular shape defined by four sides when viewed in plan view.

36. The light emitting device according to claim 35, wherein
the base structure includes
a first straight side extending in the second direction when viewed from the first direction, and
a second straight side extending in the third direction when viewed from the first direction.

37. A light emitting device comprising:
a base structure including a first base surface and a second base surface opposite to the first base surface in a first direction, wherein the base structure includes a base member; and
a light emitting element configured to emit light, the light emitting element comprising:
a first semiconductor layer;
a first electrode comprising:
a first electrode surface exposed from the second base surface to an outside of the light emitting device; and
a first contact surface contacting the first semiconductor layer; and
a second electrode provided separately from the first electrode, wherein the base member includes an intermediate portion provided between the first electrode and the second electrode, wherein the second electrode includes a second electrode surface, wherein the second surface is spaced apart from the first electrode surface in a second direction different from the first direction,
the second electrode surface comprising:
a first part extending longitudinally in a third direction different from each of the first direction and the second direction, the first part of the second electrode surface extends within an opening on the second base surface to be exposed from the second base surface to the outside of the light emitting device; and
a second part extending longitudinally from the first part in the second direction, the second part being provided to avoid overlapping with an area of the first contact surface when viewed from the first direction, the second part of the second electrode surface extends within an opening on the second base surface to be exposed from the second base surface to the outside of the light emitting device,
wherein the base member forms the second base surface, and wherein the base member at the second base surface includes a light reflection material to reflect light emitted from the light emitting element so that light emitted from the light emitting element is emitted out of the light emitting device through the first base surface,
wherein the second part extends from the first part toward the first electrode surface in the second direction, and
wherein the entire first electrode surface has a substantially rectangular shape defined by four sides when viewed in plan view.

38. The light emitting device according to claim 37, wherein
the base structure includes
a first straight side extending in the second direction when viewed from the first direction, and
a second straight side extending in the third direction when viewed from the first direction.

39. A light emitting device comprising:
a base structure including a first base surface and a second base surface opposite to the first base surface in a height direction along a height of the light emitting device, the second base surface being divided by a hypothetical straight line into a first part second base surface and a second part second base surface; and
a light emitting element having a light emitting surface and an electrode side opposite to the light emitting surface in the height direction, the light emitting element being provided in the base structure such that the light emitting surface faces toward the first base surface to emit light from the first base surface, the light emitting element comprising:
a first electrode having a first electrode surface within the first part second base surface on the second base surface and provided on the electrode side to pass through the base structure such that the first electrode surface is exposed on the second base surface; and
a second electrode having a second electrode surface within the second part second base surface on the second base surface and provided on the electrode side to pass through the base structure such that the second electrode surface is exposed on the second base surface, the second electrode surface having a shape including projections projecting toward the first electrode surface when viewed in the height direction,
wherein the second part extends from the first part toward the first electrode surface in the second direction, and
wherein the entire first electrode surface has a substantially rectangular shape defined by four sides when viewed in plan view.

40. The light emitting device according to claim 39, wherein the light emitting element comprises
a semiconductor layer, and
contact surfaces separately provided on the semiconductor layer and electrically connected to the first electrode.

41. The light emitting device according to claim 39, wherein the first electrode surface, the second electrode surface, and the second base surface are provided to be substantially flush.

42. The light emitting device according to claim 40, wherein the second electrode surface has the shape including projections projecting not to overlap the contact surfaces when viewed in the height direction.

43. The light emitting device according to claim 40, wherein the first electrode and at least one of the contact surfaces overlap when viewed in the height direction.

44. The light emitting device according to claim 40, Wherein the second electrode surface has the shape including at least one recess between the projections, at least one of the contact faces being arranged in the at least one recess when viewed in the height direction.

* * * * *